(12) United States Patent
Ratnam

(10) Patent No.: US 8,885,407 B1
(45) Date of Patent: Nov. 11, 2014

(54) VERTICAL MEMORY CELLS AND METHODS, ARCHITECTURES AND DEVICES FOR THE SAME

(76) Inventor: Perumal Ratnam, Fremont, CA (US)

( * ) Notice: Subject to any disclaimer, the term of this patent is extended or adjusted under 35 U.S.C. 154(b) by 641 days.

(21) Appl. No.: 13/009,761

(22) Filed: Jan. 19, 2011

Related U.S. Application Data

(60) Provisional application No. 61/296,441, filed on Jan. 19, 2010.

(51) Int. Cl.
*G11C 16/04* (2006.01)

(52) U.S. Cl.
USPC ............ 365/185.08; 365/185.05; 365/185.17; 257/315; 257/316; 257/324; 257/329

(58) Field of Classification Search
USPC .......................... 365/185.05, 185.08, 185.17; 257/314–316, 324, 329
See application file for complete search history.

(56) References Cited

U.S. PATENT DOCUMENTS

| | | | |
|---|---|---|---|
| 6,937,510 B2 * | 8/2005 | Hosono et al. ........... | 365/185.03 |
| 7,541,242 B2 * | 6/2009 | Prall et al. ..................... | 438/259 |
| 7,995,390 B2 * | 8/2011 | Park et al. ................. | 365/185.17 |
| 2008/0242028 A1 * | 10/2008 | Mokhlesi et al. ............. | 438/270 |
| 2008/0259691 A1 | 10/2008 | Lung | |
| 2011/0241098 A1 * | 10/2011 | Park et al. ..................... | 257/324 |

OTHER PUBLICATIONS

Kim et al., "A Vertical 4-Bit SONOS Flash Memory and a Unique 3-D Vertical NOR Array Structure." IEEE Transactions on Nanotechnology, vol. 9, No. 1., Jan. 2010, pp. 70-77.
Fukuzumi et al., "Optimal Integration and Characteristics of Vertical Array Devices for Ultra-High Density, Bit-Cost Scalable Flash Memory." IEEE 2007, pp. 449-452.
Hsiao et al., "A Critical Examination of 3D Stackable NAND Flash Memory Architectures by Simulation Study of the Scaling Capability." IEEE 2010, 4 pages.
Ishiduki et al., "Optimal Device Structure for Pipe-shaped BiCS Flash Memory for Ultra High Density Storage Device with Excellent Performance and Reliability." IEEE 2009, pp. 27.3.1-27.3.4.
Datta et al., "Dual-Bit/Cell SONOS Flash EEPROMs: Impact of Channel Engineering on Programming Speed and Bit Coupling Effect." IEEE Electron Device Letters, vol. 28, No. 5, May 2007, pp. 446-448.
Chang et al., "A New SONOS Memory Using Source-Side Injection for Programming." IEEE Electron Device Letters, vol. 19, No. 7, Jul. 1998, pp. 253-255.
Wu et al., "A Novel High-Speed, 5-Volt Programming EPROM Structure with Source-Side Injection." IEEE 1986, 6 pages.
Jang et al., "Vertical Cell Array using TCAT (Terabit Cell Array Transistor) Technology for Ultra High Density NAND Flash Memory." 2009 Symposium on VLSI Technology Digest of Technical Papers, pp. 192-193.
Kim et al., "Multi-Layered Vertical Gate NAND Flash Overcoming Stacking Limit for Terabit Density Storage." 2009 Symposium on VLSI Technology Digest of Technical Papers, pp. 188-189.
Mohapatra et al., "Effect of Source/Drain Asymmetry on the Performance of Z-RAM® Devices." IEEE 2009, 2 pages.

* cited by examiner

*Primary Examiner* — Allison P Bernstein

(57) ABSTRACT

A memory device may include a plurality of cell pairs each including insulator regions interposed between opposing sides of at least one common word line gate and first and second vertical sides formed by a spacing within at least one semiconductor material; and at least one selector gate vertically aligned with the word line gate within the spacing configured to enable first and second source regions in the first and second vertical sides, respectively; wherein when the selector gate is enabled, the first and second source regions are connected to different source diffusion regions.

8 Claims, 20 Drawing Sheets

PROGRAM OPERATION: WL0 first to WL3 last

ERASE LOCATION

PROGRAM OPERATION: Simulataneous WLs

US 8,885,407 B1

VERTICAL MEMORY CELLS AND METHODS, ARCHITECTURES AND DEVICES FOR THE SAME

This application claims the benefit of U.S. Provisional Patent Application Ser. No. 61/296,441, filed on Jan. 19, 2010 the contents of which are incorporated by reference herein.

TECHNICAL FIELD

The present disclosure relates generally to memory devices, and more particularly to memory cells oriented in a vertical direction with respect to a device substrate.

BACKGROUND

Electrically erasable and programmable read-only memories (EEPROMs), in particular, "flash" type EEPROMs (hereinafter flash memories), have become an essential requirement for many portable electronic devices such as "smart" phones, tablet computing devices, and cameras, as but a few examples. Flash memories include both NAND and NOR types. NAND flash memories have higher densities than NOR flash memories, and thus may be less costly per bit. However, unlike NAND flash memories, NOR flash memories can be programmed on a byte-by-byte basis. Accordingly, NOR type flash memories are typically used for storing data, such as code, that is more frequently programmed on a byte-by-byte basis, while NAND type flash memories may be used to store large data files.

Most memory devices, including NAND and NOR type flash memories and dynamic random access memory (DRAM), are organized as an array of memory cells. FIG. 1 depicts such an array 1000, which includes memory cells 1001-1016 organized as an array. A source line 1024 is connected to every memory cell 1001-1016. A word line 1020 is connected to memory cells 1001-1004. Another word line 1021 is connected to memory cells 1005-1008. A word line 1022 is connected to memory cells 1009-1012. A word line 1023 is connected to memory cells 1013-1016. A bit line 1030 is connected to memory cells 1001, 1005, 1009 and 1013. A bit line 1031 is connected to memory cells 1002, 1006, 1010 and 1014. A bit line 1032 is connected to memory cells 1003, 1007, 1011 and 1015. A bit line 1033 connected to memory cells 1004, 1008, 1012 and 1016. Each memory cell is built in a substrate 1019 (shown in FIG. 2).

The memory cells (1001-1016) at the array points (intersections of word lines WL0-WL3 and bit lines BL0-BL3) store one or more bits of data and are addressable by addresses that include row addresses and column addresses. Each row can correspond to a word line, WL0-WL3. When a given word line (i.e., a row) is selected, each column 1030-1033 represents a bit line, BL0-BL3, in the word line corresponding to the selected word. The value of the charge held in the corresponding memory cell for a given word line and bit line is the value associated with the word/bit address of that memory cell. For example, the charge value inside memory cell 1001 is associated with the word corresponding to WL0 and the bit corresponding to BL0. Accordingly, the value of the memory cell 1001 is retrieved from the array 1000 by activating the word line WL0, at row 1020, and the bit line BL0 at column 1030, and then measuring the current that results when the cell 1001 is thus connected to the bit line BL0 at column 1030. The common source line 1024 is connected to each memory cell 1001-1016, and is maintained at a generally fixed voltage level (potentially including, ground level).

In memory arrays made up of NOR flash memories, memory cells such as the memories 1001 through 1016 of FIG. 1 are each typically implemented at a given array point as a horizontally oriented transistor, an example of which is shown in FIG. 2. Each transistor acts as a memory cell (hereinafter, "cell").

FIG. 2 illustrates a conventional transistor 1006 memory cell from FIG. 1. Transistor 1006 includes a source 1051 connected to a common source line (e.g., 1024 of FIG. 1), a drain 1052 connected to bit line 1031 (BL1) and a control gate 1050 connected to a word line (e.g., 1021 WL1 in FIG. 1). The transistor 1006 also includes a floating gate 1060, which serves as a charge storage medium, an oxide layer 1070 between the control gate 1050 and the floating gate 1060, and an oxide layer between the floating gate 1060 and part of the substrate 1019. The floating gate 1060 is insulated by the oxide layer 1070 between the control gate 1050 and the floating gate 1060. The value stored by the memory cell 1006 is held as a charge 1061 inside the floating gate 1060, and is retrieved by activating the word line corresponding to control gate 1050 and activating BL1 1031, and then measuring the value of the current that flows between source 1051 through a source line (e.g., 1024) and bit line BL1 1031. The value of the current is a function of the charge 1061. As is known to those skilled in the art, the floating gate 1060 can hold charge at more than one location. For example, in some nitride storage-based technologies, charge may be stored in two locations, and hence one transistor may store two data bits.

It is desirable to achieve higher densities in flash memory devices. To address this need, some flash memory array architectures have been proposed in which the flash memory cells are vertically oriented within the substrate. Such architectures achieve higher densities than the sort of architectures shown in FIG. 2, in which the flash memory cells are horizontally oriented within the substrate.

FIG. 3 illustrates a conventional pair of memory cells 1101 built in to a substrate 1100 that would lie at each array point of a vertically oriented flash memory array. The cell-pair 1101 includes a vertically oriented trench 1110 etched into the substrate 1100. The cell-pair 1101 further includes two sources 1120, 1130 at the bottom of and on either side of the trench 1110, two drains 1140, 1150 at the top of and on either side of the trench 1110, two control gates 1121, 1131, and two floating gates 1141, 1151. The source-drain-control-gate-floating gate combination 1120, 1140, 1121, 1141 forms a first flash cell 1125 extending down the left-hand wall of the trench 1110, while the source-drain-control-gate-floating gate combination 1130, 1150, 1131, 1151 forms a second flash cell 1135 extending down the right-hand wall of the trench 1110. Each floating gate, 1141, 1151, holds a charge 1143, 1153 respectively, that represents the value stored by memory cell 1125, 1135 respectively. Each floating gate 1141, 1151 can hold more than one charge if, for example, nitride-based storage media technology is used. Each array point of a vertically oriented flash array thus has two cells 1125, 1135, which each can hold one or more charges, as compared to the single cell that lies at each array point of a horizontally oriented flash array (as shown in FIG. 1), thus resulting in a two-fold increase in the density of a flash array.

An example of a vertically oriented flash memory array architecture is proposed in U.S. Pat. No. 7,230,848 (hereinafter the '848 patent). With the vertically oriented array of FIG. 3, the width of each trench is roughly half as wide as the pitch of the fabrication technology being used to build the memory arrays (i.e., if the pitch is 90 nm, the width of the trench will be 45 nm in order to achieve economical densities). To build such an array, two word lines are placed side by side in a narrow trench. In such an array, electromagnetic interference phenomena such as charge leakages, over-charging, and capacitance-coupling (hereinafter, referred to as disturbs) between its more closely spaced neighboring memory cells may occur. More specifically, using present fabrication technology, the width of the trench separating each cell of a cell pair, and thus the distance between the two cells of a cell pair, is typically 45-65 nm, while the distance between neighboring cell pairs is also typically 45-65 nm. At these geometries, as each cell on either side of a cell-pair is activated, disturbs between the cells across each trench ("intra-cell-pair disturb") become more likely. Applying increased densities may also result in disturbs between cells that belong to different neighboring cell-pairs ("inter-cell-pair disturb"). As each such neighboring cell is activated, disturbs between the cells across the substrate and one more trenches become more likely.

Dynamic random access memories (DRAMs) enjoy wide application in various devices. DRAMs may store data as a charge with a capacitance, and enjoy relatively low power consumption at the cost of being volatile, and requiring periodic refresh (i.e., recharging of a capacitor). Some conventional DRAMs may have storage capacitors formed in a substrate or over a substrate.

SUMMARY

Improved vertically oriented cell arrays may allow programming on a byte-by-byte basis or sector bases, may be easier to build, have reduced or no inter-cell-pair or intra-cell-pair disturbs, and retain their density advantages as compared to horizontally oriented NOR flash cell arrays and cost-effectively support higher densities.

In one embodiment, a flash memory array may be implemented as a series of narrow openings that are closely spaced from one another, and each opening having a vertically oriented memory cell on each of its sides that can each hold one or more charge storage bits.

Intra-cell-pair disturbs between the left and right cells of the opening (collectively, cell-pairs) can be reduced by placing a variable output impedance on each source line of each cell, and then varying the impedance in the source line such that only one of the two cells in each cell-pair is activated during an access operation. With only one cell in each cell-pair activated at any one time (i.e., either the left cell or the right cell of the cell-pair active at any one time, but not both at one time), disturbs across the opening from one cell to the other can be reduced, which in turn can result in the reduction of intra-cell-pair disturbs.

Inter-cell-pair disturbs between neighboring cells each belonging to a different opening (e.g., disturbs between a right cell of a first cell-pair, and the nearby left or right cell of a second neighboring cell-pair) may be reduced by activating only one of those two neighboring cells at any one time. This can be accomplished by connecting each cell-pair to a cell-pair selector gate, and activating the cell-pair selector gates of the array in a pattern such that the cell-pair selector gates of any two neighboring openings are not selected during an access operation. By activating the cell-pair selector gates in such a manner, cells that each belong to neighboring cell-pairs are not both selected during any one access operation, such that disturbs across the substrate and/or an opening from a cell belonging to one cell pair to a cell belonging to a neighboring cell pair are reduced, i.e., providing a reduction of inter-cell-pair disturbs.

Other embodiments may include capacitor-less dynamic random access memory having gates that are vertically aligned within an opening.

DETAILED DESCRIPTION

Various embodiments will now be described that show memory cells, architectures including such cells, and methods for such cells, that may provide high density disturb resistant operations that may extend memory densities beyond expected scaling limits.

Figure 4:
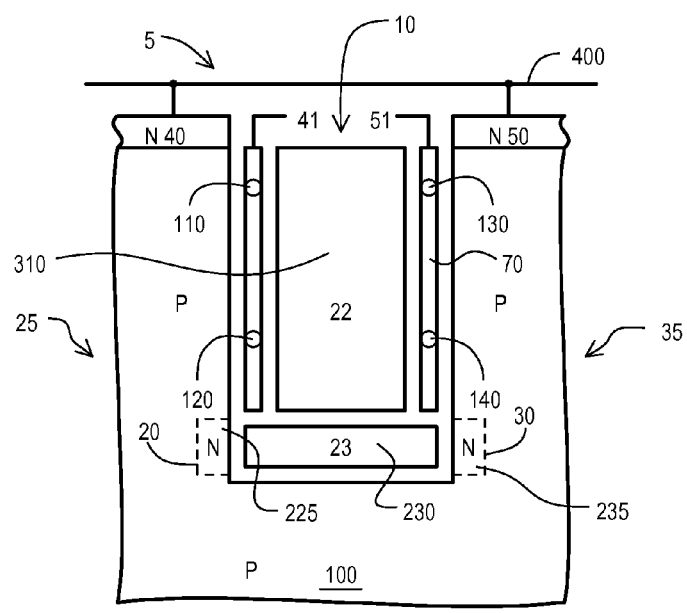
FIG. 4 is a side cross sectional view of "vertical" charge storage memory cells according to one embodiment.

FIG. 4 depicts a cell-pair structure 5 that may be built in to a substrate 100, and in particular embodiments may represent a structure lying at an array point of a vertically oriented flash memory array. A cell-pair 5 may include a vertically oriented opening 10 formed with respect to a substrate 100. The cell-pair 5 may further include sources 20, 30 at the bottom of and on either side of the opening 10, two drains 40, 50 at the top of and on either side of the opening 10, and two charge storage structures 41, 51, which will be referred to as floating gates 41, 51. However, it is understood that floating gates 41, 51 may be formed by conductor, semiconductor and/or insulating material. Floating gates 41, 51 may each run parallel to and slightly separated from the part of the sidewall of the opening 10 that extends between the sources 20, 30 and the drains 40, 50 respectively.

The source-drain-floating-gate combination 20, 40, 41 forms part of a first flash cell 25 extending down the left hand wall of the opening 10, while the source-drain-floating-gate-combination 30, 50, 51 forms part of a second flash cell 35 extending down the right hand wall of the opening 10. Each array point of a vertically oriented flash array thus has two cells 25, 35, which each can hold one or more charge storage bits. This is in contrast to a conventional approach like that of FIG. 2, resulting in a two-fold increase in the density compared to such a NOR array approach.

Additionally, the cell-pair 5 further includes a common control gate 22 shared by each cell 25, 35 of the cell pair 5, and a cell-pair selector gate 23. The common control gate 22 may be formed in the opening 10, and positioned between, and slightly separated from, each of the floating gates 41, 51. This is in contrast to a conventional approach like that of FIG. 3, in which two separate control gates are formed within an opening.

Preferably, floating gates 41, 51 are based on nitride storage technology, and enable the storage of at least two charge bits per cell. Thus, the cell-pair 5 structure can provides a cell 25 having two charge storage locations, 110, 120 that correspond to two values held in memory, and provides a cell 35 having two charge storage locations, 130, 140 that correspond to two additional values held in memory.

Figure 1:
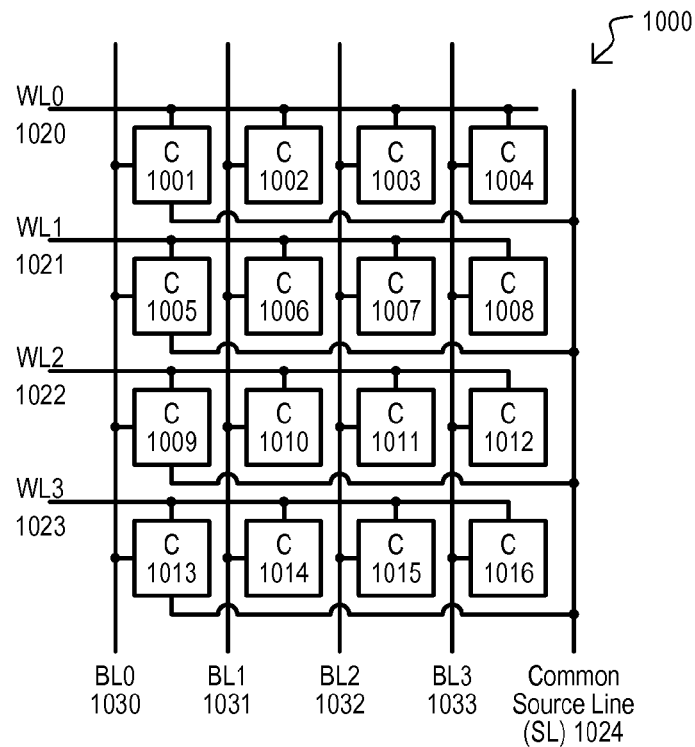
FIG. 1 is a block schematic diagram of a memory array.

In some embodiments, each cell 25, 35 of the cell pair 5 can share a bit line 400 that may be connected to the drains 40, 50. In such a configuration, bit line 400 may functionally corresponds to any of the bit lines 1030-1033 of FIG. 1. Each cell pair 5 may also share a common word line 310 that may be connected to the common control gate 22. In some embodiments, word line 310 functionally corresponds to any of the word lines 1020-1023 of FIG. 1. When a bit line 400 is connected to both cells 25, 35 of the cell pair 5 may be accessed by the same bit/word line combination.

Figure 5:
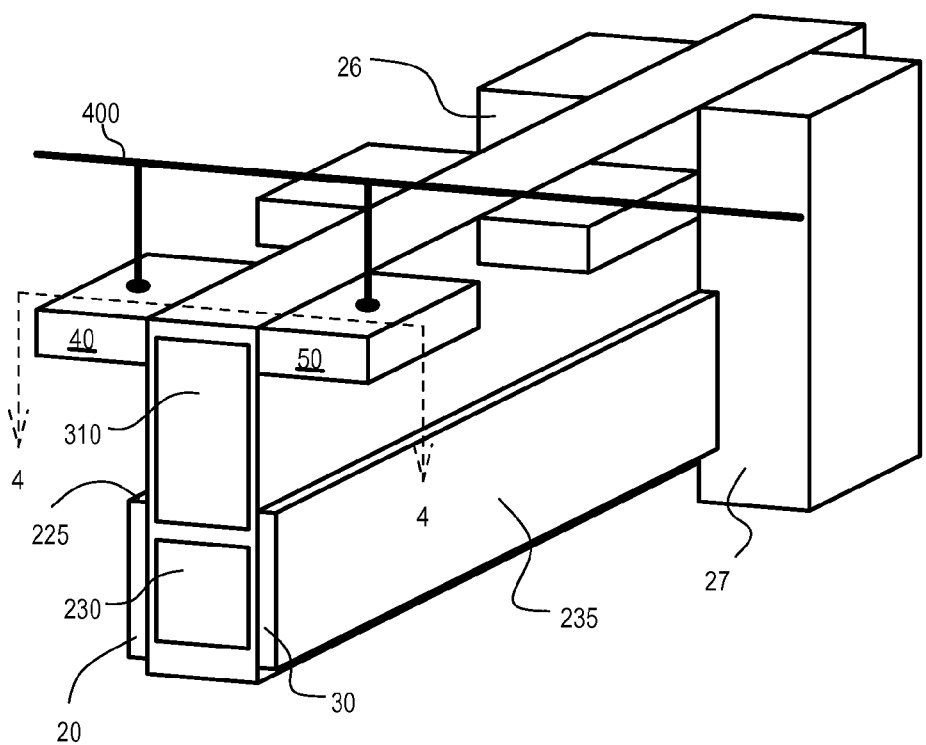
FIG. 5 is a perspective view of a memory device structure that may connect memory cells to source diffusion with source lines according to an embodiment.

A source 20, 30 of each cell 25, 35 may be part of a corresponding source line (shown in FIG. 5 as 225, 235). Source lines 225, 235 may connect each of the two sources 20, 30 respectively, to different source diffusion region (shown as 26, 27 in FIG. 5), so that each of the two cells 25, 35 in the opening 10 can be accessed, and thus programmed, erased and read, independently of one another. As shown in FIG. 4, for the left cell 25 to be accessed, the source line 225 may be activated. For the right cell 35 to be accessed, the source line 235 may be activated. With the source lines 225 and 235 not both simultaneously active, intra-cell-pair disturb may be reduced since no two cells, such as 25, 35, in a cell pair, such as 5, are simultaneously selected.

The cell-pair selector gate 23, which is connected to, or integral to, cell pair selector line 230, is common to both cells 25, 35 of the cell pair 5, and is activated for the source 20, 30 of either cell 25, 35 to be activated. The cell-pair selector gate 23 thus provides a highly granular degree of control over which cell pairs can have activated cells during any given access operation, and which cell pairs cannot have activated cells during that same access operation. As will be shown below, this feature can be exploited to reduce inter-cell pair disturb. For the cell pair 5, and thus the cells 25, 35 to be accessed, the cell pair selector line 230 is activated. As long as the cell pair selector line 230 of two neighboring cell pairs are not both simultaneously active, inter-cell-pair disturb is reduced since no two cells belonging to neighboring cell pairs, are simultaneously selected, as will be shown using FIG. 6. It is noted that a selector gate 23 may create sources 20, 30 by inverting a portion of the vertical sides to create an N-type region within a P-type substrate 100.

It is also noted that while an opening 10 may be formed by creating an opening in substrate 100, a substrate 100 could be composed of multiple layers and/or materials. As but one example, a substrate may be a monocrystalline semiconductor, polycrystalline semiconductor, or combinations thereof. Even more particularly, a substrate may be a semiconductor material that fills a vertical space between word line(s) and selector gate stacks deposited after the gate stacks are formed.

FIG. 5 shows a 3D perspective view/birds' eye view of structures that may include a cell pair like that of FIG. 4. More specifically, FIG. 5 illustrates the cell pair selector line 230, the common word line 310, the source lines 225, 235, the common bit line 400, the drains 40, 50 and sources 20 and 30. FIG. 5 also illustrates a cross section line 4-4 that corresponds to the view of the cell-pair illustrated in FIG. 4.

FIG. 5 also illustrates source diffusion regions 26 and 27, which were previously described in the description of FIG. 4 (but not shown in FIG. 4). Source diffusion region 27 is connected to the source 30 through the source line 235. Likewise, a different source diffusion region 26 is connected to the source 20 through the source line 225.

The use of cell-pair selector gates to achieve granular control over which cell pairs have active cells, and the use of source lines to achieve granular control over which cells within a cell pair are active, in an array of cell pairs 5 can reduce intra-cell-pair and inter-cell-pair disturb using the techniques described herein.

Figure 6:
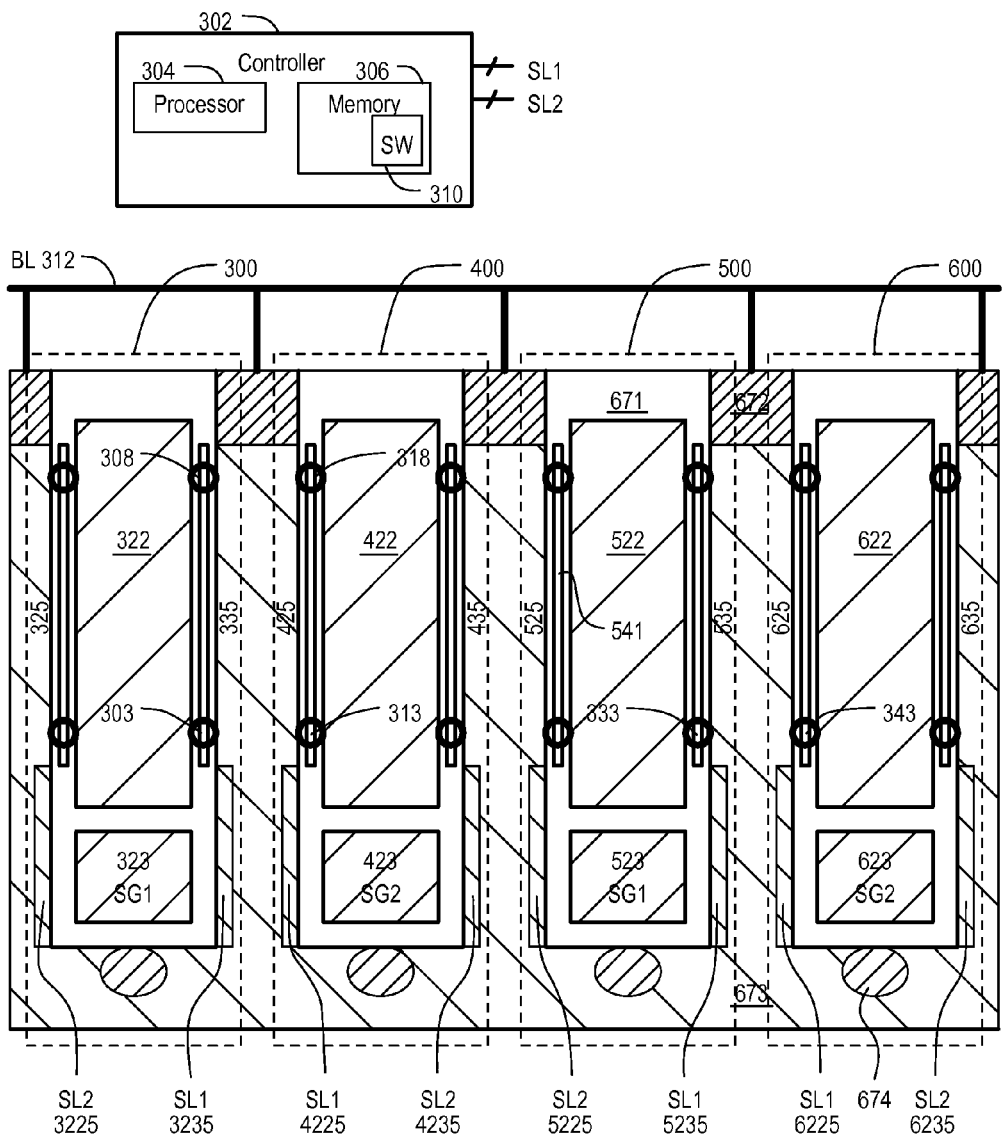
FIG. 6 is a side cross sectional view and block diagram showing a "vertical" charge storage memory device according to an embodiment.

FIG. 6 depicts several cell pairs 300, 400, 500, 600, that are each structured, and that each operate, like the cell-pair structure 5 shown in FIGS. 4 and 5. A controller 302 includes a processor 304 connected to memory 306 that stores software 310. The processor 304 can read and execute software code instructions stored in the memory 310 to perform functions described herein. The controller 302 outputs signals on lines SL1 and SL2 to control the cells as described and outputs signals on cell pair select gate lines (source-gate lines) SG1 and SG2. Alternate embodiment may include custom logic alone or in combination with a processor to generate signals on lines SL1 and SL2.

Activation of alternate selector gates SG1 (323, 523) or SG2 (423, 623) produces inversion layers to create source lines 3225, 3235, 5225, 5235 or source lines 4225, 4235, 6225, 6235 (but not both groups of source lines). With a controller as shown in FIG. 6, for the cell pair 300, for the left cell 325 to be programmed, the source line SL2 3225 is activated. For the right cell 335 to be programmed, the source line SL1 3235 is activated. As long as the source lines 3225 and 3235 are not both simultaneously activated, intra-cell-pair disturb can be reduced as no two cells, such as 325, 335, in a cell pair, such as 300, are active during the same access operation. Similar observations can be made with respect to the cell pairs 400, 500 and 600.

In particular embodiments, the controller 302 can operate such that no two cells in a cell pair are active during the same access operation by (a) driving an activation signal on source lines SL1 to enable connection to the sources of the following pairs of adjacent cells: 335 and 425, 535 and 625, and (b) driving an activation signal on source lines SL2 to enable connections to the following pairs of adjacent cells: 325 and the cell to its left (not shown), 435 and 525, 635 and the cell to its right, and (c) operating SL1 and SL2 in a patterning arrangement such that SL1 and SL2 are not (preferably ever) both active during the same access operation. By following steps (a), (b) and (c), no cell pair will have both a left cell and a right cell that is active during any given access operation which thus reduces intra-cell pair leakage.

By connecting the cells in FIG. 6 to the common signals SL1 and SL2 as described above (i.e., by connecting a common source line signal, SL1, to the sources of the following pairs of adjacent cells: 335 and 425, 535 and 625), pairs of neighboring cells belonging to different cell pairs, such as 335 and 425, or 535 and 625, can be connected to the same source diffusion regions (not shown). This allows neighboring cells belonging to different cell pairs, and thus the cell pairs themselves, to be placed more closely together without unduly complicating the manufacturing process of the cell array illustrated in FIGS. 4, 5 and 6 and also reduces the complexity of signal flow path and the number of signals used in the chip during program, read and erase operations.

To inhibit the SL1-SL2 operation pattern described above from creating significant inter-cell disturb between the neighboring cells of different cell pairs, such as the cells 335 and 425, or 535 and 625, no two cell-pair selector gates 323, 423, 523, 623 of any two neighboring cell pairs 300, 400, 500, 600 are simultaneously active. For example, by keeping the cell-pair selector gate 323 of the cell pair 300 active, and the cell-pair selector gate 423 of the neighboring cell pair 400 inactive, a significant variant of inter-cell pair disturb is reduced because, for example, the right cell 335 of the cell pair 300, will not be active (since the source line SL1 will not be active when SL2 is active) at the same time as the left cell 425 of the neighboring cell pair 400. A similar observation can be made with respect to the following pairs of cells: 435 and 525, 535 and 625. The foregoing on-off-on-off pattern of cell pair selector gates is implemented by (a) connecting the cell-pair selector gate 323, 523 of every "odd" cell pair structure 300, 500 to a common "odd" cell-pair selector gate signal, (b) connecting the cell-pair selector gates 423, 623, of every "even" cell pair structure 400, 600 to a common "even" cell-pair selector gate signal, and (c) activating the signals such that the "even" and "odd" cell-pair selector signals are not simultaneously activated.

This odd/even patterning arrangement, when combined with the SL1/SL2 patterning arrangement described above, also reduces another variant of inter-cell disturb by inhibiting, for example, the cell pair 325 and 435 from (preferably ever) being active during the same access operation, which in turn can reduce the possibility of inter-cell disturb occurring between those two cells. A similar observation can be made with respect to the following pairs of cells: 335 and 435, 425 and 525; 435 and 535; 525 and 625; 535 and 635. When the word line connecting the control gate 322 is selected, all the other word lines connecting to gates 422, 522, 622 (and also the gate to the left of 322) sharing the same bit line 312 are not selected.

Referring still to FIG. 6, each memory cell pair may have an opening insulator (one shown as 671), which may be an oxide in particular embodiments. Bit line 312 may be connected to drain diffusions (one shown as 672) at a top portion of each opening side, that is shared between cells of different cell pairs (i.e., drain diffusion 672 is shared by cells 535 and 625). In particular embodiments, a drain diffusion 672 may be N-doped silicon and/or polysilicon, while a substrate 673 may be P-doped silicon and/or polysilicon. A substrate 673 may form a p-well for transistors of the memory cell pairs, as well as channel regions for such memory cell pairs. Word line gates 322, 422, 522, 622 may be formed from a suitable conductive material, and may include a metal and/or polysilicon in particular embodiments. Similarly, selector gates 323, 423, 523, 623 may be formed from a suitable conductive material, and may include a metal and/or polysilicon in particular embodiments. A field implant region (one shown as 674) may be higher doped P-type region formed at a bottom of each opening. Charge storage regions (one shown as 541) may include a layer of silicon nitride separated from substrate sides by silicon oxide and separated from a word line gate 522 by silicon oxide, forming an "O—N—O" layer.

Figure 7:
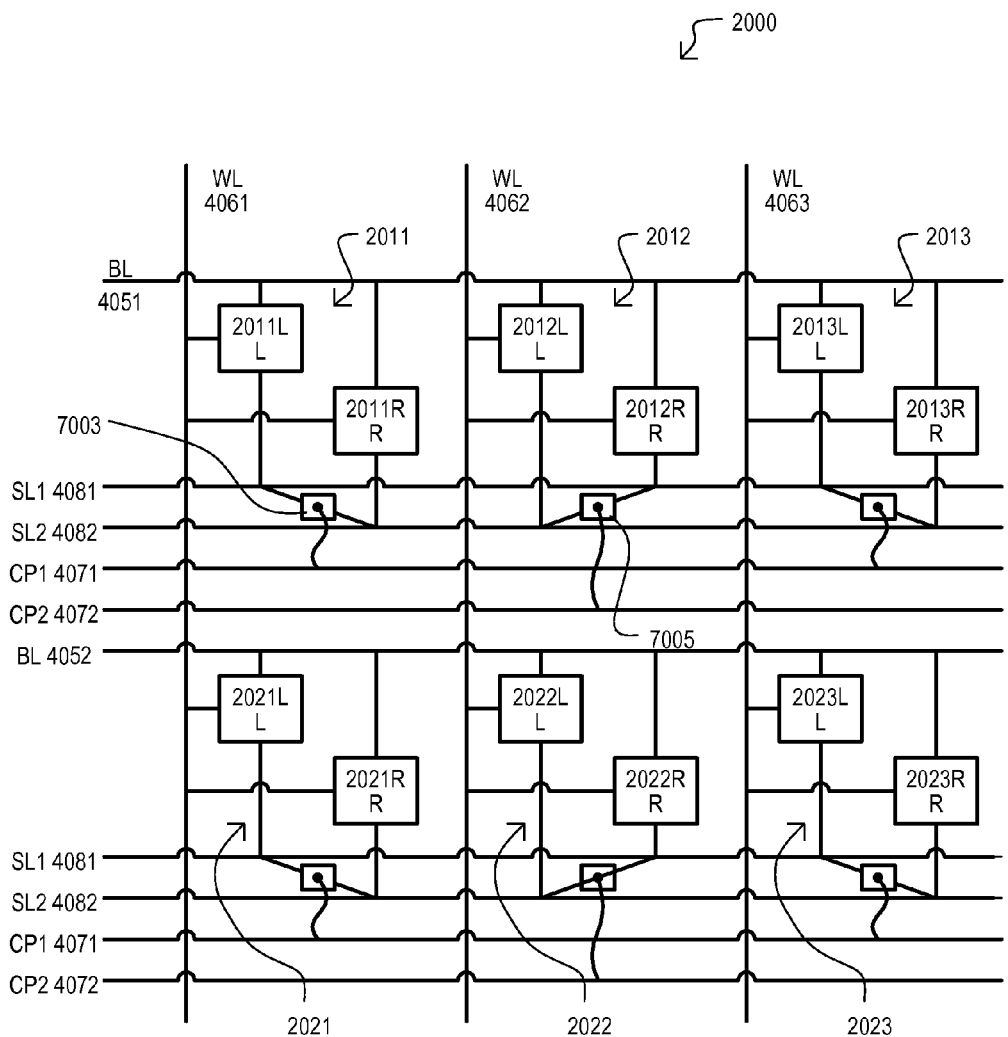
FIG. 7 is a schematic diagram representation of a memory device according to an embodiment.

Referring to FIG. 7, a view of a partial array of memory cells 2000, comprising cell pairs 2011, 2012, 2013, 2021, 2022, 2023, is shown. Cell pair 2011 in turn comprises the following cells: 2011 left (L), 2011 right (R). Cell pair 2012 comprises the following cells: 2012L, 2012R, etc.

Each of the cells 2011-2023 L/R, is structured and operated like the cells illustrated in FIGS. 4, 5 and 6. The partial array 2000 also includes word lines 4061-4063, bit lines 4051-4052, cell pair selector connections (CP1, CP2) 4071, 4072, and source line connections (SL1, SL2) 4081, 4082. Cell pair selector connection CP1 4071 is connected to the cell pair selector gates (one shown as 7003) of all the "odd" cell pairs 2011 L/R, 2013 L/R, 2021 L/R, 2023 L/R. Cell pair selector connection CP2 4072 is connected to the cell pair selector gates (one shown as 7005) of all the "even" cell pairs 2012 L/R, 2014 L/R (not shown in the figure) etc., 2022L/R, 2024L/R (not shown in the figure). Cell pair selector gates (e.g., 7003, 7005) may represent inversion layers created by activation of selector gates to create sources and source lines connected to source diffusion regions.

Source line connection 4081 is connected to the source lines of all the "SL1" cells 2011L, 2012R, 2013L, 2014R (not shown), 2015L (not shown) etc., connected to bit line 4051. The same source line connection 4081 is also connected to the source lines of all the "SL1" cells 2021 L, 2022R, 2023L, 2024R (not shown), 2025L (not shown) etc. in the bit line 4052. Source line connection 4082 is connected to the source lines of all the "SL2" cells 2011 R, 2012L, 2013R, 2014L (not shown), 2015R (not shown) etc. connected to bit line 4052. Same source line connection 4082 is also connected to the source lines of all the "SL2" cells 2021 R, 2022L, 2023R, 2024L (not shown), 2025R (not shown) etc. connected to bit line 4052.

Each cell in the array 2000 is accessed by a word line/bit line/cell pair selector/source line connection value. For example cell 2022L is accessed by activating word line WL 4062, the bit line 4052, the cell pair selector 4072 and the source line connection 4082.

With the granular programming techniques described above, the pattern of activation for a typical sequence of two neighboring cell pairs such as 300 and 400, shown in FIG. 6, can look as follows:

TABLE 1

| Clock Cycle | Cell Pair 300 | Cell Pair 400 | Source Line 1 | Source Line 2 | Activated Cell |
|---|---|---|---|---|---|
| 1 | 0 | 1 | 1 | 0 | 425 |
| 2 | 0 | 1 | 0 | 1 | 435 |
| 3 | 1 | 0 | 1 | 0 | 335 |
| 4 | 1 | 0 | 0 | 1 | 325 |

In this table, "0" means not active and "1" means activated. Also, access operations are shown as clock cycles.

Note that for each of the activated cells identified in the table above, in each successive clock cycle shown in the table the data is accessed by changing the WL and BL values, but keeping the odd or even cell-pair high and addressing the left or right source line. There could be many other ways to do this in a manner that avoids activating more than one cell within any two neighboring cell pairs at any one time. Also note that in other embodiments, the activated cell patterns can be varied using techniques known in the art to reduce noise, improve speed and also reliability of the cells, such as endurance. The activation algorithms can also depend on a specific application depending on the byte size and read mode, etc. The activation algorithms can be suitably modified to select only a byte, or a few bytes, or a partial sector, or a smaller sector during the program and also erase operations of the array.

Programming Conditions:

Returning to FIG. 4, where the charge storage media 70, for example, is comprised of nitride storage media as in a preferred embodiment, the charge bits 130 at the top of the nitride storage media 70 can be programmed using channel hot electrons (CHE) injected into the nitride storage media 70. One particular programming technique can include setting WL=+7 to 12V, BL=+4 to 6V and cell pair selector gate=+5 to 10V, in order to provide an appropriate amount of electrons to the channel as shown in the table below:

TABLE 2

| WL (control Gate) | Drain (top N+) | Source (bottom) | Cell pair Gate1 | Programmed Charge Bits |
|---|---|---|---|---|
| 7 V (WL1) | 5 V (BL1) | 0 V (SL1) | 7 V (SG1) | Top bit of the nitride storage medium |

Returning to FIG. 4, where the charge storage media 70 is comprised of nitride storage media as preferred, the charge bits 140 at the bottom of the nitride storage media 70 is programmed using source side injection, which results in charge injection that is localized at the lower half of the nitride storage media 70. The source side injection uses a very high electric field at the edge of the source 30 of the cell 35 to create a hot electron flow at low channel current levels. These hot electrons are injected under the source's edge to the nitride storage media 70 by an aiding field between cell-pair selector gate 23 and control gate 22. The high field at the edge of the source 30 is created by suitable biasing of the cell-pair selector gate 23, source 30, and control gate 22, with drain 50 at a reasonable voltage. A back-bias of the source 30 helps to control the cell 35 at or around the sub-threshold region. A modest voltage is applied at the cell-pair selector gate 23, and a higher voltage is applied at the control gate 22 as shown in the table below.

TABLE 3

| WL (control Gate) | Drain (top N+) | Source (bottom) | Cell pair Gate1 | Programmed Charge Bits |
|---|---|---|---|---|
| 9 V (WL1) | 4 V (BL1) | 0.5 V (SL1) | 2 V (SG1) | Bottom bit of the nitride storage medium |

Read Conditions:

Returning to FIG. 4, where the charge storage media 70 is comprised of nitride storage media, the read condition currents applied to the cell 35 can depend on whether the top bit 130 or the bottom bit 140 is being read. The voltage (Vt) of the cell 35, when reading the top bit, is a function of the corresponding charge 130 stored at the top of the charge storage media 70. If the charge is high, Vt for the cell 35 is higher near the top of the cell 35 (i.e., near the drain 50). Hence, keeping the drain 50 at ground, and applying a voltage to the source 30, allows for the measurement of Vt by measuring the current flowing through the cell 35 using known techniques, and thus effects an indication of the value of the charge 130 and therefore the corresponding top bit. Typical voltages applied to the control gate, drain, source for read operations on the top bit 130 of a cell 35 are shown below:

TABLE 4

| WL (control Gate) | Drain (top N+) | Source (bottom) | Cell pair Gate | Read Charge Bit |
|---|---|---|---|---|
| 3 to 4 V (WL1) | 0 V (BL1) | 1 to 2 V (SL1) | 5 V (SG1) | Top bit of the nitride storage medium |

The bottom bit 140 stored in the nitride storage medium 70 can be read by applying voltage at the drain 50, grounding the source 235, and keeping the control gate 22 at the same voltage as when reading the top bit 130. The voltage $V_t$ of the cell 35, when reading the bottom bit, is a function of the corresponding charge 140 stored at the bottom of the charge storage media 70. If the charge is high, $V_t$ for the cell 35 is higher near the bottom of the cell 35 (i.e., near the source 30). Hence, keeping the source 30 at ground, and applying a voltage to the drain 50, allows for the measurement of $V_t$ by measuring the current flowing through the cell 35 using known techniques, and thus effects an indication of the value of the charge 140 and therefore the corresponding bottom bit. Typical voltages applied to the control gate, drain, source for read operations on the bottom bit 140 of a cell 35 are shown below.

TABLE 5

| WL (control Gate) | Drain (top N+) | Source (bottom) | Cell pair Gate | Read Charge Bit |
|---|---|---|---|---|
| 3 to 4 V (WL1) | 1 to 2 V (BL1) | 0 V (SL1) | 5 V (SG1) | Bottom bit of the nitride storage medium |

Erase Operation

The erase of the cells 25, 35 can be performed by combining channel and drain erase techniques known to those skilled in the art. Typical voltages that are applied to effect an erase operation are shown below:

TABLE 6

| Sector Erase of 256 cells to 1M cells at a time | All WL control Gates | All Drains (top N+) | All Source Lines (bottom inversion layer) | All Cell pair selector gates | P-Well (common to all cells in the array) |
|---|---|---|---|---|---|
| 1M to 4M bits at a time | GND to −10 V | Float or connected to high impedance | Not connected or float | GND to −10 V | 10 V to 15 V |

The erase voltages shown in the table above are to be applied to all control gates, source gates, drains and cell pair selector gates of the array, as well as to the P-well that is common to each of the cells in the cell array. There are some variations to channel erase that can be implemented using techniques that are known in the art. For example, cell pair select gates can be used to erase only bottom bits in a cell pair.

It is understood that the potentials shown in the tables above represent but particular embodiments. Such voltages may be vary according to device size, doping concentrations, charge storage media, as well gate and substrate material, to name but a few. One skilled in the art would arrive at voltage suitable for a device based on the teachings set forth herein.

Referring now to FIGS. 8A to 8E, particular operations for a memory array like that shown in FIG. 6 are shown. FIGS. 8A to 8E include the same reference characters as FIG. 6.

Figure 8A:
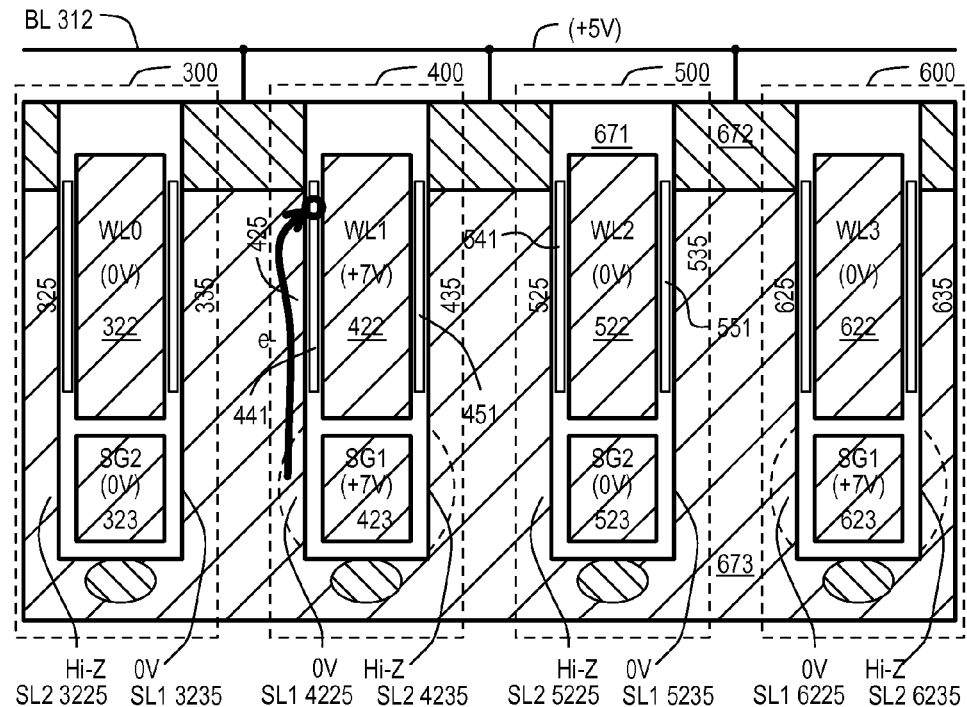
FIGS. 8A to 8E are side cross sectional views showing various operations for a memory device like that shown in FIG. 6.

FIG. 8A shows one representation of a programming operation for an "upper" bit of cell 425 as described above. "Odd" Selector gates 423, 623 may be driven to an active level to create sources 4225/4235 and 6225/6235 by inverting a substrate 673 in the adjacent opening sides. It is noted that while odd selector gate 623 creates sources 6225 and 6235, because word line gate 622 is at a de-select voltage, memory cell 625, which has a source connected to zero volts is not programmed. As noted above, the bias conditions may enable channel hot electron injection to program an upper portion of charge storage region 441.

Figure 8B:
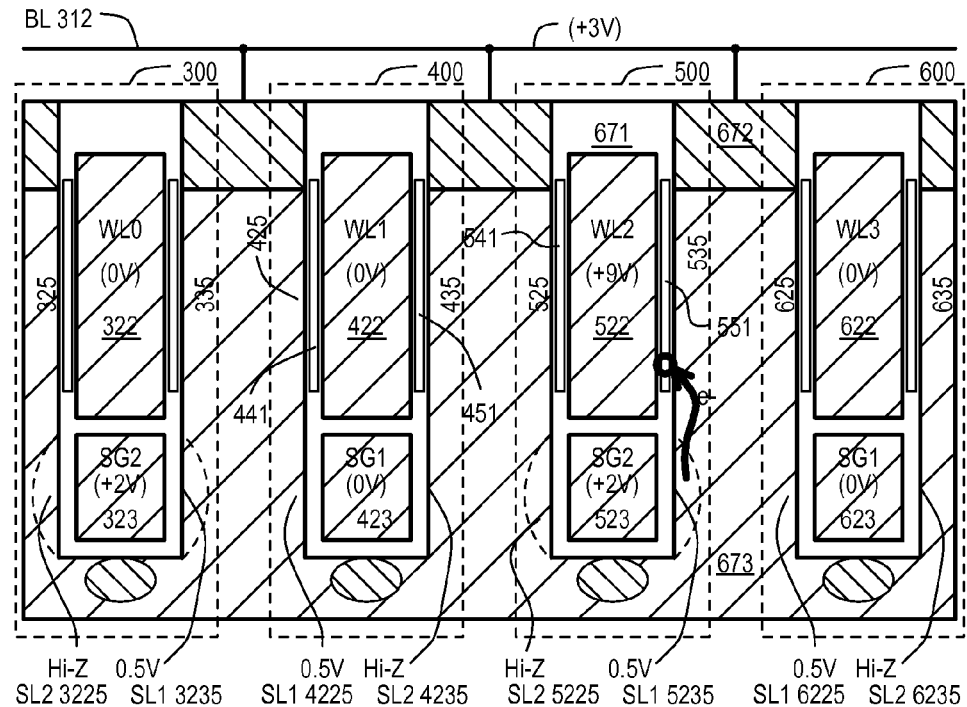

FIG. 8B shows one representation of a programming operation for a "lower" bit of cell 535 as described above. "Even" selector gates 323, 523 may be driven to an active level to create sources 3225/3235 and 5225/5235 by inverting a substrate 673 in the adjacent opening sides. Similar to the case of FIG. 8A, because word line gate 322 is at a de-select voltage, memory cell 335 is not programmed. As noted above, the bias conditions may enable source side injection to program a lower portion of charge storage region 551.

Figure 8C:
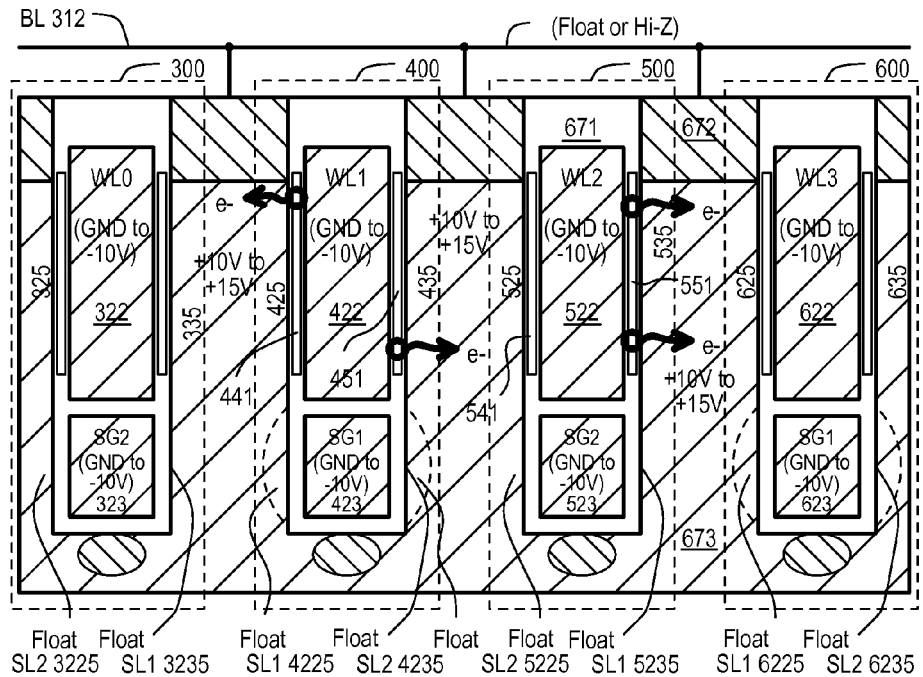

FIG. 8C shows one representation of a "flash" erase operation. A flash erase operation may simultaneously erase multiple cells in the same operation. Thus, in such an embodiment, data writes may include a flash erase directed to a set of memory cells (e.g., byte, sector, etc.), followed by a data dependent program operation. The erase operation may include driving word line gates (322, 422, 522, 622) and selector gates (323, 423, 523, 623) to a low or negative voltage (0 to −10V), while a substrate 673 may be driven to a relatively positive voltage +10 to +15 V. In such an arrangement, charge may tunnel from charge storage regions (e.g., 441, 451, 541, 551) to substrate 673.

Figure 8D:
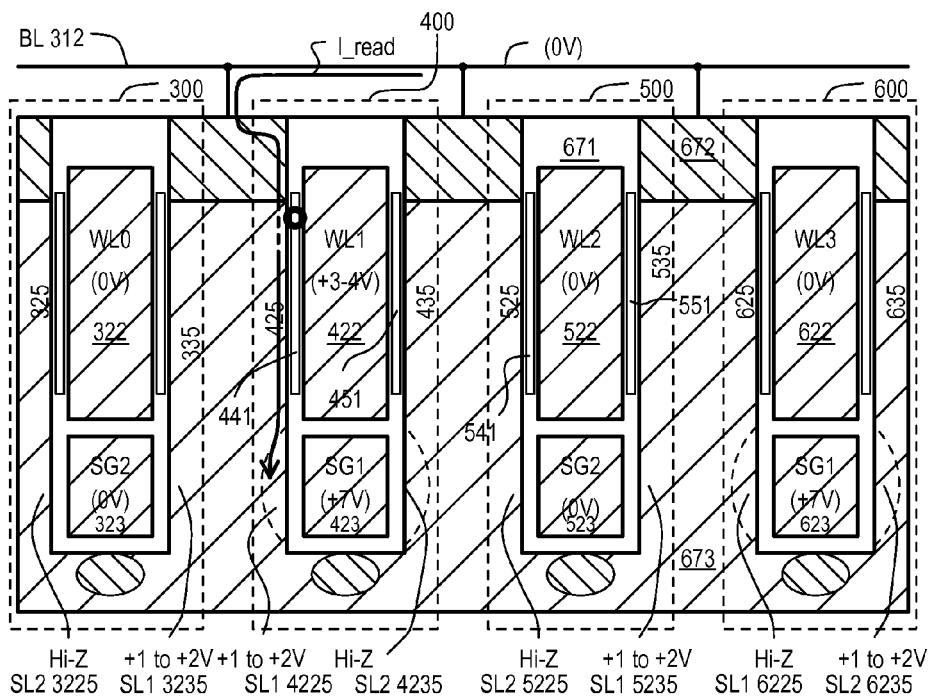

FIG. 8D shows one representation of a read operation for an "upper" bit of cell 425 as described above. "Odd" selector gates 423, 623 may be driven to an active level to create sources 4225/4235 and 6225/6235 by inverting a substrate 673 as described above. As in the case of the program operations described above, while odd selector gate 623 creates sources 6225 and 6235, a current will not flow through memory cell 625, which has a source connected to +1V to +2V, as word line 622 is at a de-select voltage, turning off the memory cell channel.

Figure 8E:
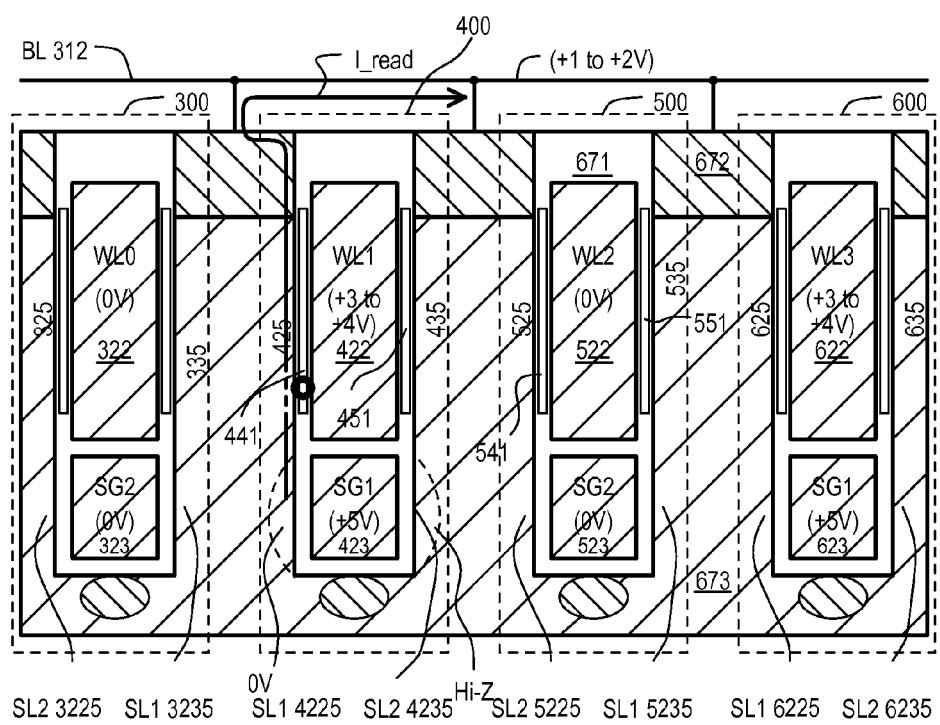

FIG. 8E shows one representation of a read operation for a "lower" bit of cell 425 as described above. Current may flow in the reverse direction to that of FIG. 8D.

Figure 2:
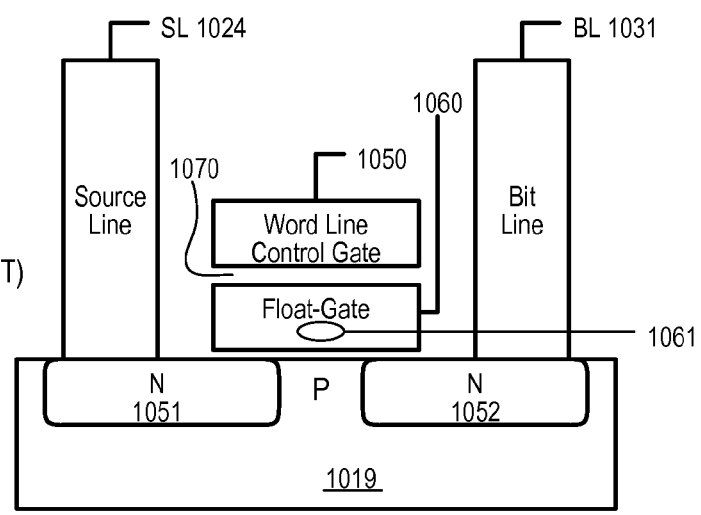
FIG. 2 is a side cross sectional view of a conventional "horizontal" charge storage memory cell.
Figure 3:
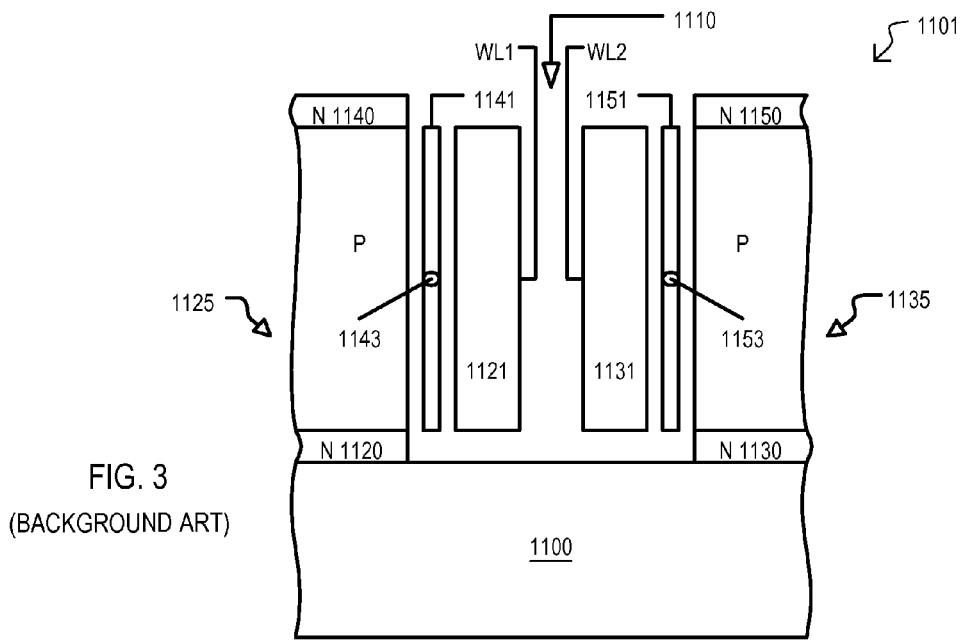
FIG. 3 is a side cross sectional view of conventional "vertical" charge storage memory cells.

The embodiment of FIGS. 8A to 8E may be utilized as a NOR type memory device, providing vertically oriented memory cell pairs that may be more dense and less prone to disturb conditions as compared to conventional approaches like those shown in FIGS. 2 and 3. However, embodiments may also include NAND type memory architectures as described below.

Alternate embodiments may stack multiple word line gates with selector gates to create NAND type memory architectures. Particular embodiments of such NAND architectures will now be described.

Figure 9:
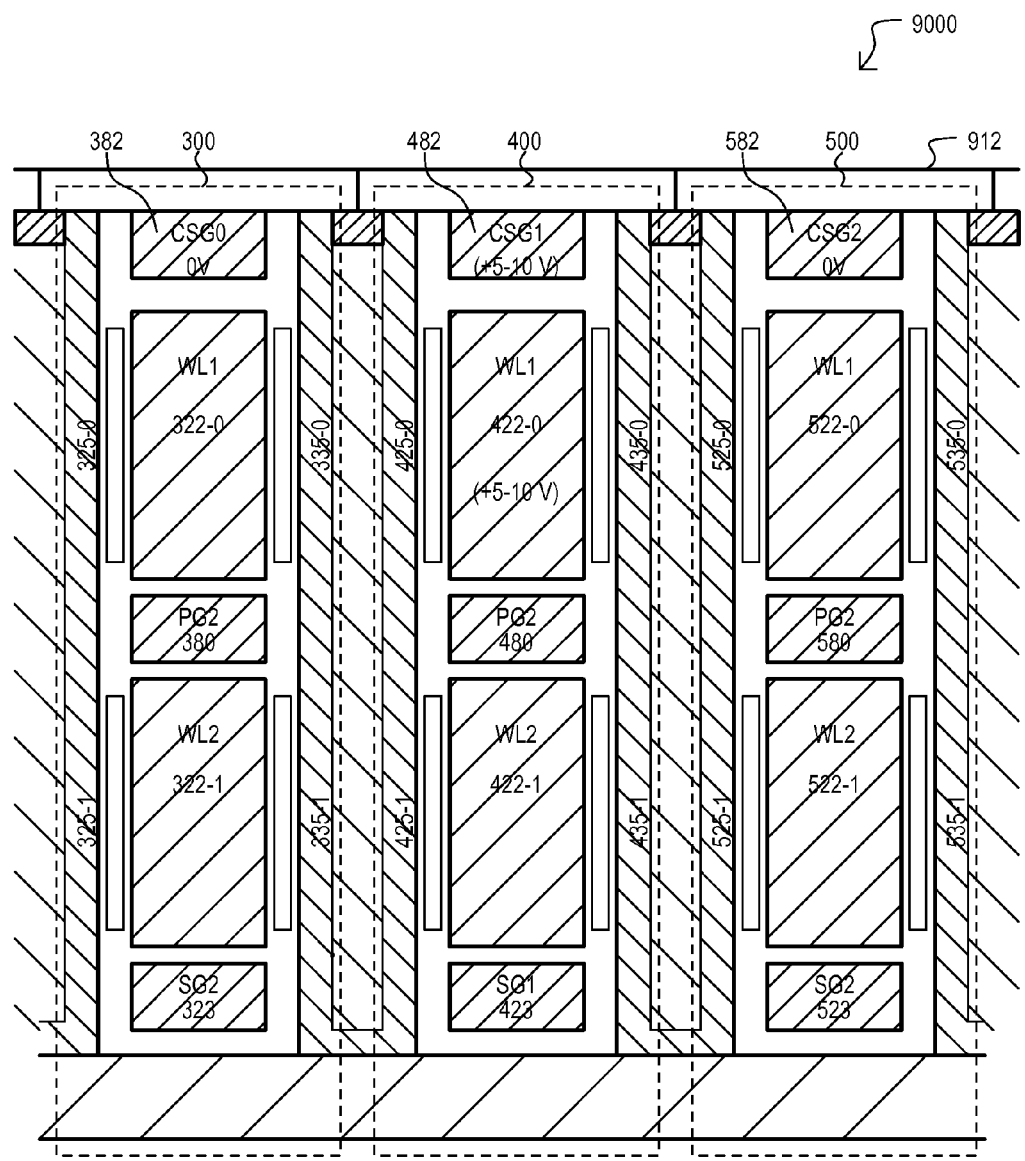
FIG. 9 is a side cross sectional view of a NAND type memory architecture according to an embodiment.

Referring to FIG. 9 a first example of a NAND architecture is shown in side cross sectional view and designated by the general reference character 9000. Architecture 9000 may include memory cell groups 300, 400, 500 that each include four memory cells each capable of storing two data bits, and each formed in an opening (e.g., trench). Architecture 9000 may be conceptualized as formed by stacking memory cell structures like those of FIG. 4, 5 and/or 6 on top of one another.

In the architecture of FIG. 9, memory cell group 400 includes "upper" memory cells 425-0/435-0 and "lower" memory cells 425-1/435-1. Each memory cell group (300, 400, 500) may include a same structure. For example, group 400 may include a gates vertically aligned with on another within a same opening, including an access gate (CSG) 482, an upper word line gate 422-0, a program gate (PG) 480, a lower word line gate 422-1, and a selector gate (SG) 423.

Like the arrangement of FIG. 6, even selector gates (323, 523) may be activated together, while odd selector gates (e.g., 423) may be de-activated, and vice versa. Program gates 380, 480, 580 may be activated in the same manner, with even program gates 380, 580 being activated and de-activated while odd program gates (e.g., 423) are de-activated and activated, respectively.

Unlike the arrangement of FIG. 6, all upper word lines 322-0, 422-0, 522-0 may be activated substantially simultaneously, to enable access to upper memory cells 325-0/335-0, 425-0/435-0, 525-0/535-0. Similarly, all lower word lines 322-1, 422-1, 522-1 may be activated substantially simultaneously, to enable access to lower memory cells 325-1/335-1, 425-1/435-1, 525-0/535-1.

Access to a particular memory cell group (300, 400, 500) may be accomplished by activating an access gate 382, 482, 582. Thus, access gates (382, 482, 582) may be driven separately in program and/or read operations.

In one embodiment of FIG. 9, programming charge into memory cells may be a done by source-side injection, by suitable choice of a voltage applied to bit line 912, PG/SG voltages and word line voltages. A charge injection location can be changed by the choice of the voltage, and thus give two bits for each cell giving a total of 4-bits per side of the opening. In total, 8-bits may be accessed per CSG in the embodiment shown.

However, it is understood that addition word lines and program gates may be added for even higher densities. Each such additional word line/program gate layer can add another four bits per CSG.

Referring to FIGS. 10A to 10E another example of a NAND architecture is shown in side cross sectional view and designated by the general reference character 1000. Architecture 1000 may include memory cell groups 1001-0, 1001-1, 1001-2 that each include eight memory cells each capable of storing one data bit, and each formed in an opening (e.g., trench) of a substrate 1010. A substrate 1010 may be a semiconductor material, and particular embodiments may include polysilicon or substantially monocrystalline silicon. A substrate 1010 may have a base portion 1014 that may be silicon, or an insulating material (e.g., in the case of a silicon-on-insulator SOI type substrate).

Each memory cell group (1001-0 to -2) may include a same structure. For example, group 1001-1 may include a gates vertically aligned with on another within a same opening, including an access gate (CSG) 1004-1, a first word line gate 1006-10, a second word line gate 1006-11, third word line gate 1006-12, fourth word line gate 1006-13, and a selector gate (SG) 1008-1. An architecture 1000 may eliminate the need for a program gate, as in the case of the embodiment of FIG. 9, when a suitable programming sequence is used, as will be described below. It is understood that in particular embodiments, all such gates are portions of a contiguously access line, word line or selector line formed in an opening, running perpendicular (e.g., into or out of the page) to the view shown in FIGS. 10A to 10E.

Each word line (1006-00 to 1006-23) may be separated from sides of a substrate 1010 (i.e., sides of the opening/trench) by a charge storing material. While embodiments may include two charge storage locations on a side of each word line gate (and hence two storage bits), preferably only one charge storage location is used on each side of a word line gate. Having one charge storage location on opposing sides of each word line gate can relax programming conditions.

In FIGS. 10A to 10E, all memory cells may be connected to a common bit line 1012 via drain regions 1002-0 to -1.

In the embodiment of FIGS. 10A to 10E, access gates (1004-0 to -2) may be separately activated to enable access to individual memory cell groups 1001-0 to -2. However, similar to FIGS. 8A to 8E, word line gates may be commonly activated in even word line gate groups and odd word line gate groups. For example, word line gates 1006-00 and 1006-20 may be commonly activated, while word line gate 1006-10 would be de-activated, and vice versa. This common activation occurs across all word line levels, so word line gates 1006-01 and 1006-21 may be commonly activated, while word line gate 1006-11 is de-activated, word line gates 1006-02 and 1006-22 may be commonly activated, while word line 1006-12 is de-activated, etc. Similarly, selector gates (1008-0 to -2) may be activated in even and odd groups, with even selector gates 1008-0 and 1008-2 being activated (and selector gate 1008-1 being de-activated) when any even word line gates are activated, and odd selector gate 1008-1 being activated (and even selector gates 1008-0, -2 being de-activated) when any odd word line gates are activated.

Such even and odd activation may help avoid disturb between the adjacent bits during programming, similar to the embodiment described in FIG. 6.

In the embodiment of FIGS. 10A to 10E, program operations may occur according to a predetermined sequence. In particular, program operations may start from a top level of word line gates (1006-00 to -20) and proceed to each subsequently lower level of word lines. For example, a programming may start by programming one side (in this case a right side) of even word lines (1004-0, -2). Even select gates 1008-0 and -2 may be activated, and access gates (1004-0 to -1) CSG1, CSG3, CSG5, CSG7, etc. (which can correspond to rows) may be sequentially activated. For right side programming, odd source lines (1016-1) may be connected to a low voltage (e.g., 0 to +1V), while even source lines (1016-0) may be connected to a high impedance to prevent a programming of a left side.

Figure 10A:
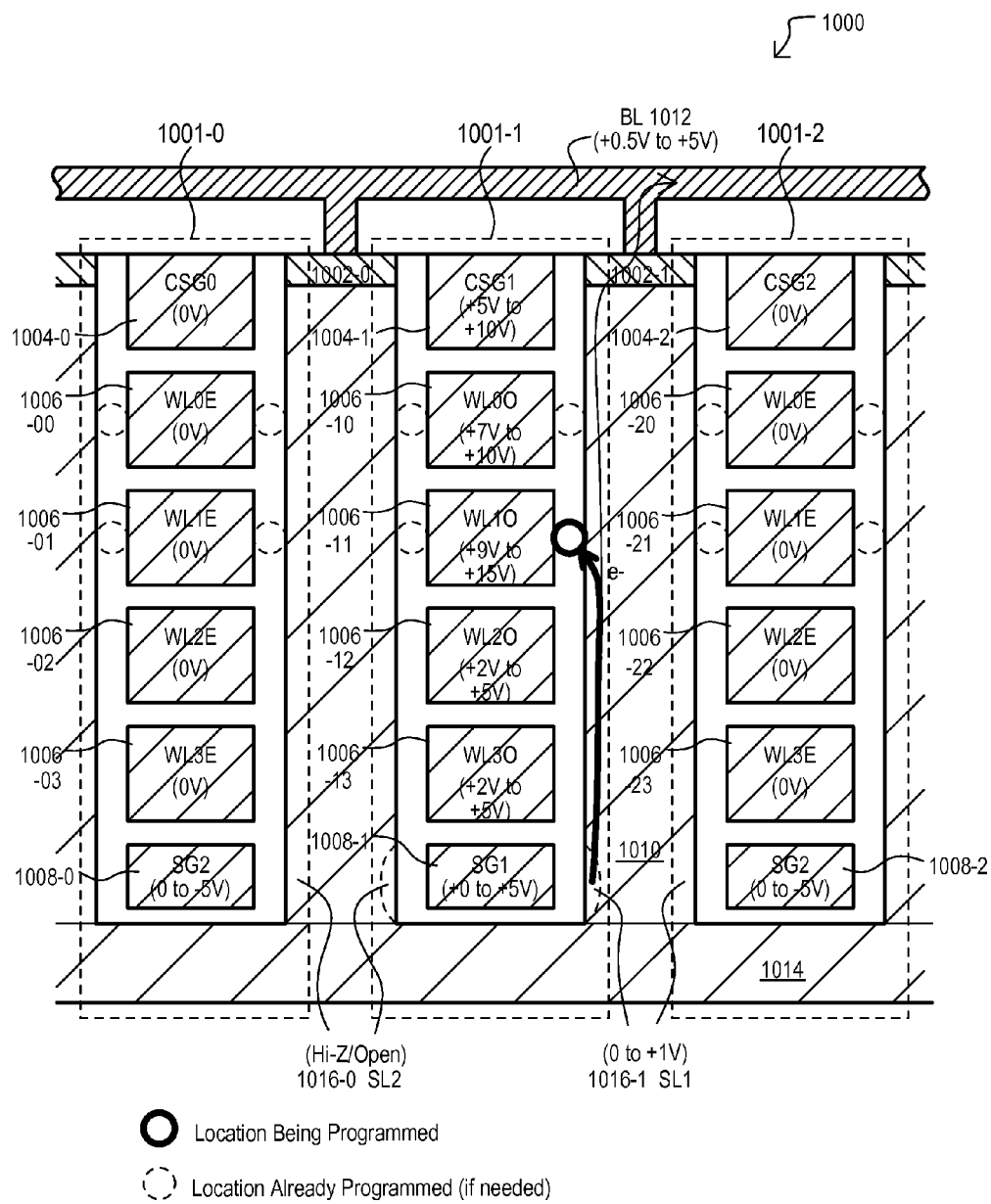
FIGS. 10A to 10E are side cross sectional views of another NAND type memory architecture and corresponding operations according to an embodiment.

In particular embodiments, word lines 1006-00 to -23 may store relatively large numbers of bit values (e.g., store data values in "pages"). As but a few examples, each word line may correspond to 512 to 1024 bytes. In a program operation, a subset of such bit lines (e.g., byte, word, double word, etc) may be driven to a write voltage. This is represented in FIG. 10A by bit line 1012 being driven to a write voltage (e.g., +0.5 to +5V) or a high impedance state according to a data value to be written. Bit lines may thus sequentially write N bits at a time into rows selected by access gates (1004-0 to -1). A width of write data (i.e., N bits) can be any suitable number selected according to architecture and/or application, and may include 16 bits or 32 bits or 64 bits depending on the requirement, or may be even wider. Once the bits on the right of side of even word lines have been programmed, then odd source lines (1016-1) may be disconnected to ground and placed into a high impedance state. Odd selector gates (1008-1) may be de-activated (in this case driven low to 0 to −5V).

Even selector gates (1008-0 to -2) may then be activated (in this case driven high to about +5 to +10V) and even source lines (1016-0) may be connected low (0 to +1 V). Odd source lines (1016-1) may be in the high impedance state. Access gates (1004-0 to -2) may then be sequentially activated while a bit line 1012 is placed in the program state appropriate for a desired data value. This may program left hand side bits of the first word line level (1006-00 to -02).

It is noted that two sets of data are written for each chosen word line (one right side and other left side of the programmed word line). This gives two times the density as compared to a standard NAND array. The same sequence as that described above can be applied to program the bits to both sides of odd word lines (1006-01) in the first word line level. Preferably, a programming sequence proceeds by selecting the source lines (e.g., 1016-0 or 1016-1) and selector gates (e.g., 1008-0/2 or 1008-1) followed by word line gates, which can eliminate "ground bounce" (pulling up of the ground level).

Referring still to FIG. 10A, word line selections can be from a top level to a bottom level (i.e., WL0, WL1, WL2, WL3 etc.) as an array is programmed. In such an arrangement, previously programmed word lines on higher levels may act as pass gates by driving them to a voltage slightly higher than that of a programmed state. Word lines of any lower levels may be set to a lower voltage. Such an arrangement may help increase programming speed for the array and reduce the program current (due to reduced charge pump loading).

FIG. 10A specifically shows one representation of the programming of the right side of word line gate 1006-11 according to the above-described method. That is, data are written into horizontal rows of word lines starting from a top row to a bottom row. In FIG. 10A it is assumed that word line gates 1006-00, -10, and -20 and 1006-01 have already been subject to a write operation (e.g., cells have been programmed or not programmed depending upon write data). Access gate 1004-1 is activated to enable bit line 1012 access to group 1001-1. Word line gate 1006-10 above the programmed word line is driven to a pass gate potential (+7V to +10V). The programmed word line 1006-11 is driven to a program voltage (e.g., +9 to +15V). The word line gate 1006-12 directly below the programmed word line is driven to a lower potential to operate as a source side injector. Odd select gates 1008-1 are activated, while even select gates (1008-0, -2) are de-activated. Odd select line 1016-1 is connected to a low voltage, while even select line 1016-0 is placed in a high impedance state.

Figure 10B:
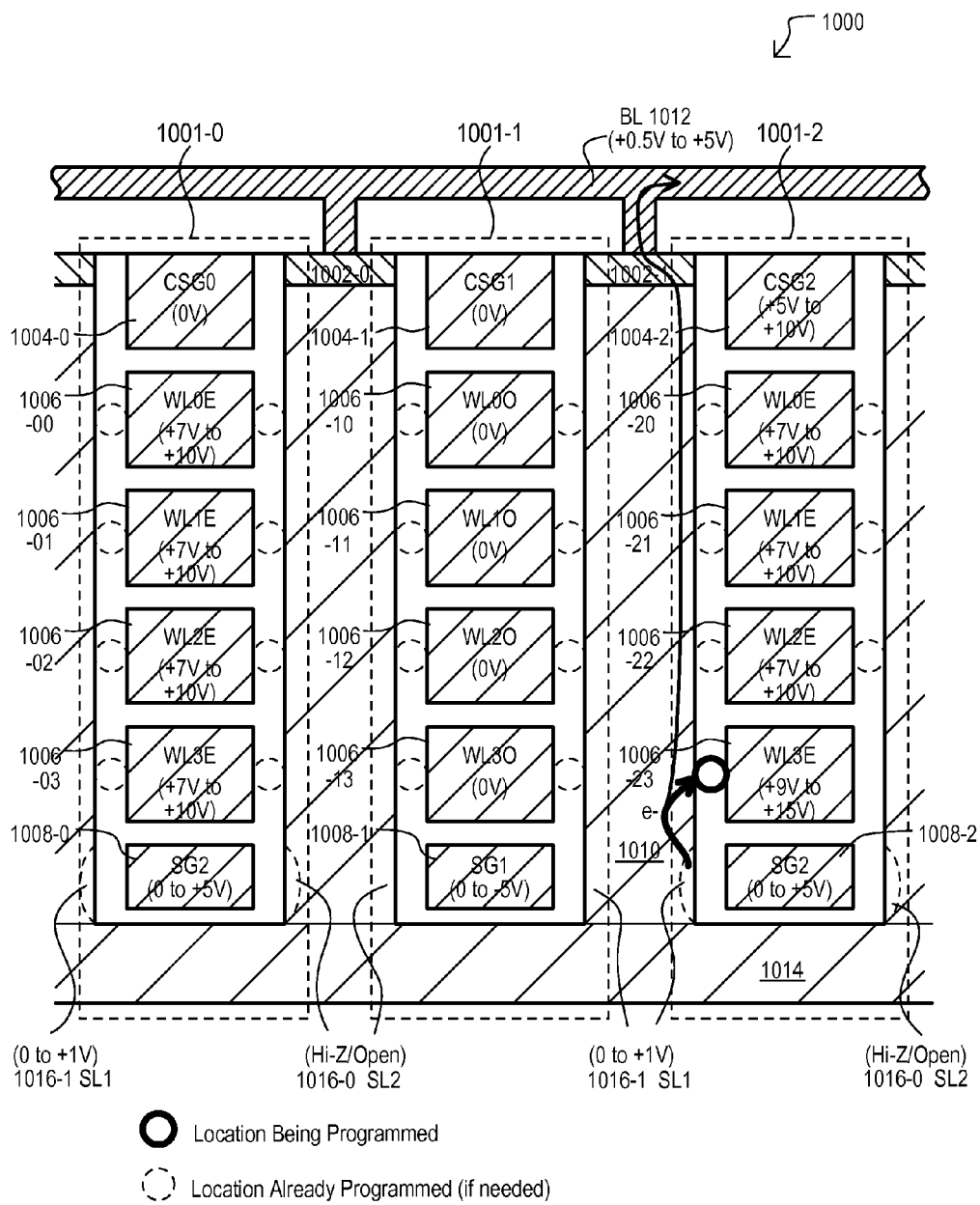

FIG. 10B shows one representation of a programming of a left side of word line 1006-23 according to the above-described method. In FIG. 10B it is assumed that word line gates 1006-00 to -20, 1006-01 to -21, 1006-03, and 1006-13 have been subject to a write operation. Access gate 1004-2 is activated to enable bit line 1012 access to group 1001-2. Word line gates 1006-20, -21 and -22 are is driven to a pass gate potential (+7V to +10V). The programmed word line 1006-23 is driven to a program voltage (e.g., +9 to +15V). Even select gates 1008-0, 2 are activated, while odd select gates (1008-1) are de-activated. Odd select line 1016-1 is connected to a low voltage, while even select line 1016-0 is placed in a high impedance state.

Examples of possible programming levels for an embodiment like that of FIGS. 10A and 10B are shown below:

TABLE 7

(Refer to FIG. 10A)

| Node | Programming the right bit of WL1O under CSG1 | Programming the left bit of WL1O under CSG1 |
|---|---|---|
| Programmed BLs (selected) | 0.5 V to 5 V | 0.5 V to 5 V |
| Other BLs (unselected) | Hi Z | Hi Z |
| Selected CSG (CSG1) | 5 V to 10 V | 5 V to 10 V |
| Unselected CSGs | 0 V to −5 V | 0 V to −5 V |
| Selected WL (WL1O) for the selected bits | 9 V to 15 V | 9 V to 15 V |
| Selected WL (WL1E) for the unselected Bits | 0 V | 0 V |
| Selected WL0O above the selected WL1O | 7 V to 10 V | 7 V to 10 V |
| Unselected WL2O, WL3O below the selected WL | 2 V to 5 V | 2 V to 5 V |
| Unselected WL0E, WL2E, WL3E of unselected stacks | 0 V | 0 V |
| SG1 (selected stack) | 0 V to 5 V | 0 V to 5 V |
| SG2 (unselected stack) | 0 V to −5 V | 0 V to −5 V |
| SL1 feed (tied to right channel of SG1) | 0 V to 1 V | Hi Z or open |
| SL2 feed (tied to left channel of SG1) | Hi Z or open | 0 V to 1 V |
| Substrate | 0 V | 0 V |
| Optional condition for Unselected BLs, if the SG1 Vt is >0 V and SL1 is set at 0 V | 0 V | 0 V |

TABLE 8

(Refer to FIG. 10B)

| Node | Programming the right bit of WL1E under CSG2 | Programming the left bit of WL1E under CSG2 |
|---|---|---|
| Programmed BLs (selected) | 0.5 V to 5 V | 0.5 V to 5 V |
| Other BLs (unselected) | Hi Z | Hi Z |
| Selected CSG (CSG2) | 5 V to 10 V | 5 V to 10 V |
| Unselected CSGs | 0 V to −5 V | 0 V to −5 V |
| Selected WL (WL1E) for the selected bits | 9 V to 15 V | 9 V to 15 V |
| Selected WL (WL1O) for the unselected Bits | 0 V | 0 V |
| Unselected WL0E above the selected WL1E | 7 V to 10 V | 7 V to 10 V |
| Unselected WL2E, WL3E below the selected WL1E | 2 V to 5 V | 2 V to 5 V |
| Unselected WL0O, WL2O, WL3O of unselected stack(s) | 0 V | 0 V |
| SG2 (selected stack) | 0 V to 5 V | 0 V to 5 V |
| SG1 (unselected stack) | 0 V to −5 V | 0 V to −5 V |
| SL2 feed (tied to right channel of SG2) | 0 V to 1 V | Hi Z or open |
| SL1 feed (tied to left channel of SG2) | Hi Z or open | 0 V to 1 V |
| Substrate | 0 V | 0 V |
| Optional condition for Unselected BLs, if the SG2 Vt is >0 V and SL2 is set at 0 V | 0 V | 0 V |

It is understood that the above programming operation shows but one embodiment. In alternate embodiments, programming may be undertaken in substantially any order provided the programmed word line is at a highest voltage (e.g., +9V to +12V) and any word line directly below (which functions as a source side injector) is at a lower voltage (e.g., +2V to +5V) to enable source side injection from the bottom side of the word line being programmed. Any word lines below source injector word line can be set at higher voltage to act as pass gates, as described above.

Figure 10C:
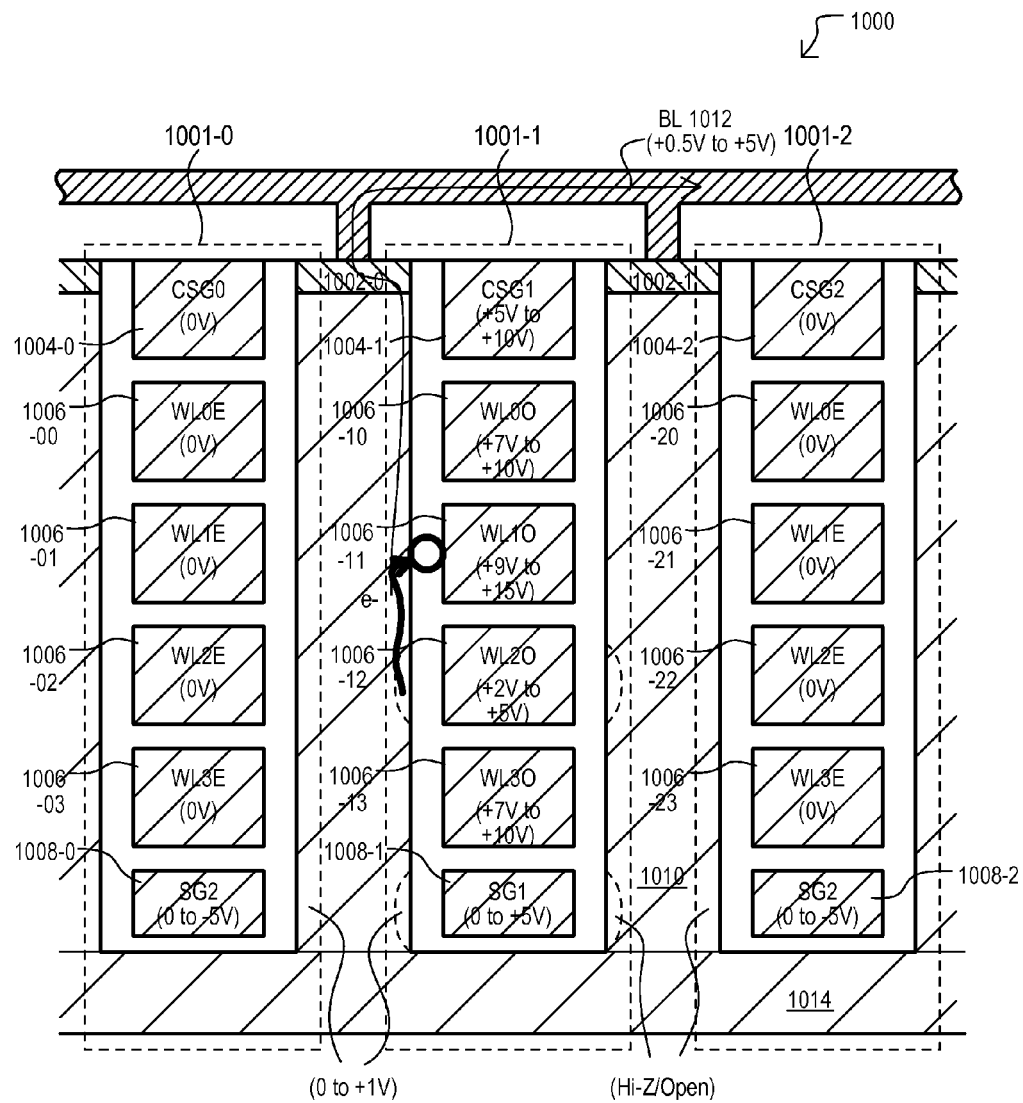

FIG. 10C specifically shows one representation of the programming of the left side of word line gate 1006-11 according to the above-described row order independent method. In FIG. 10C, access gate 1004-1 is activated to enable bit line 1012 access to group 1001-1. Word line gate 1006-10 above the programmed word line is driven to a pass gate potential (+7V to +10V). The programmed word line 1006-11 is driven to a program voltage (e.g., +9 to +15V). The word line gate 1006-21 directly below the programmed word line is driven to a lower potential (e.g., +2 to +5V) to operate as a source side injector. The word line 1006-13, below the source side injector word line gate (e.g., 1006-12) is driven to a pass gate potential (+7V to +10V). Odd select gates 1008-1 is activated, while even select gates (1008-0, -2) are de-activated. Even select line 1016-0 is connected to a low voltage, while odd select line 1016-1 is placed in a high impedance state.

Examples of possible programming levels for an embodiment like that of FIG. 10C are shown below:

TABLE 9

(Refer to FIG. 10C)

| Node | Programming the right bit of WL1O under CSG1 | Programming the left bit of WL1O under CSG1 |
|---|---|---|
| Programmed BLs (selected) | 0.5 V to 5 V | 0.5 V to 5 V |
| Other BLs (unselected) | Hi Z | Hi Z |
| Selected CSG (CSG1) | 5 V to 10 V | 5 V to 10 V |
| Unselected CSGs | 0 to −5 V | 0 to −5 V |
| Selected WL (WL1O) for the selected bits | 9 V to 15 V | 9 V to 15 V |
| Selected WL (WL1E) for the unselected Bits | 0 V | 0 V |
| Unselected WL0O above the selected WL1O | 7 V to 10 V | 7 V to 10 V |
| Unselected WL2O just below the selected WL1O | 2 V to 5 V | 2 V to 5 V |
| Unselected WL3O more than one level below the selected WL1O | 7 V to 10 V | 7 V to 10 V |
| Unselected WL0E, WL2E, WL3E of unselected stack(s) | 0 V | 0 V |
| SG1 (selected stack) | 0 V to 5 V | 0 V to 5 V |
| SG2 (unselected stack) | 0 V to −5 V | 0 V to −5 V |
| SL1 feed (tied to right channel of SG1) | 0 V to 1 V | Hi Z or open |
| SL2 feed (tied to left channel of SG1) | Hi Z or open | 0 V to 1 V |
| Substrate | 0 V | 0 V |
| Optional condition for Unselected BLs, if the SG1 Vt is >0 V and SL1 is set at 0 V | 0 V | 0 V |

The above-described programming embodiments may be more sophisticated in other embodiments, including programming pulse control and timing between various voltage levels. In some embodiments, all the above mentioned signals: select gate voltages (SG1, SG2), select line voltages (SL1, SL2), access gate voltages (CSG), word line gate voltages (WL), and bit line voltages (BL) may be generated as high voltage signals using charge pumps in an integrated circuit device product and hence the power consumption can be reduced by suitable partition of the array.

Figure 10D:
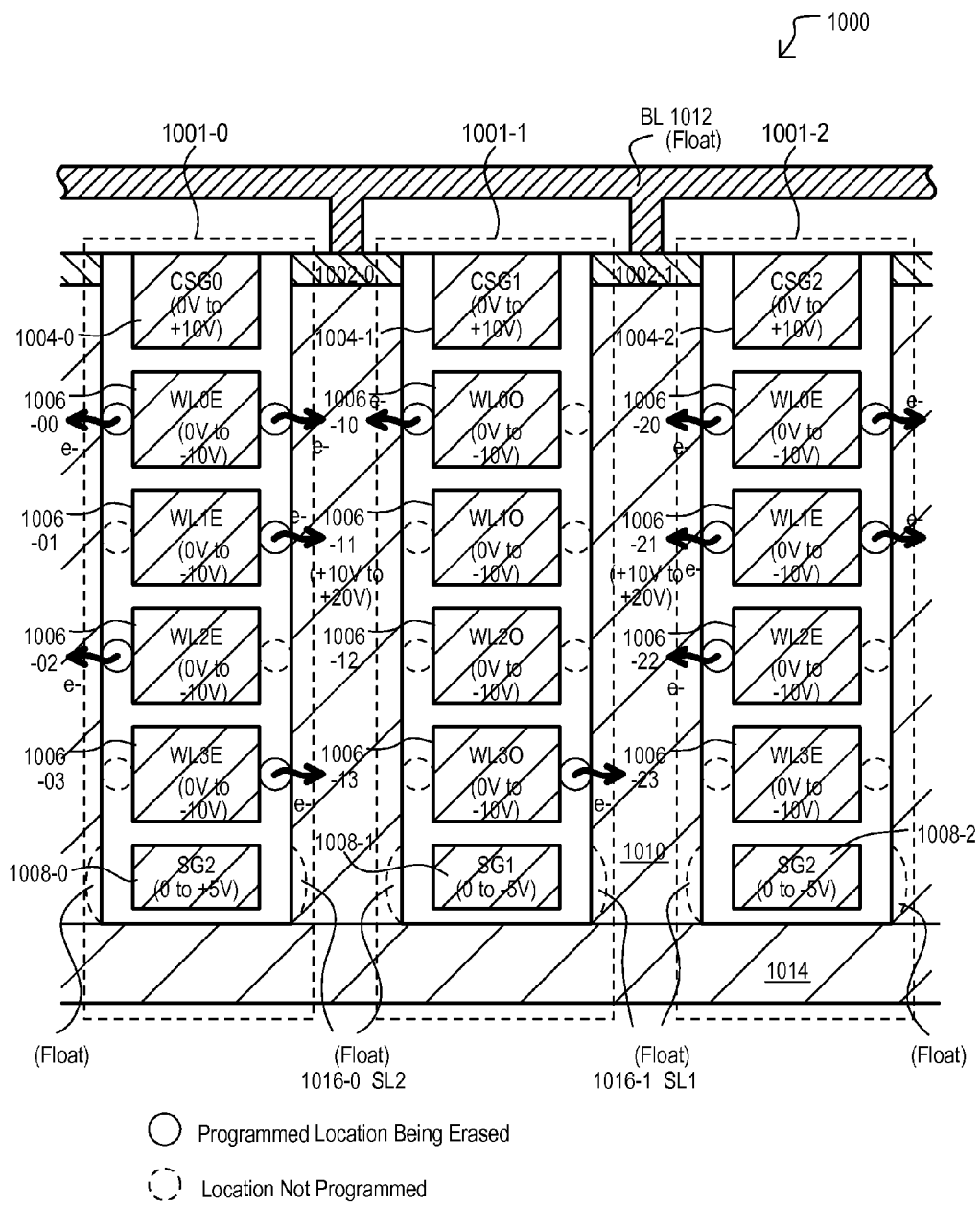

Embodiments like those shown in FIGS. 10A to 10O may be flash erased. On very particular representation of a flash erase operation is shown in FIG. 10D. In such an erase operation, access gates 1004-0 to 1004-2 may be driven in a voltage range of 0 to +10V, word line gates 1006-00 to 1006-23 may be driven to an erase voltage, which in this example may be 0 to −10V. Selector gates 1008-0 to -2 may be driven to an erase voltage of 0 to +5V. Both even and odd select gates (1008-0 and 1008-1), as well as bit line 1012, may be placed into a floating state. Finally, a substrate 1010 (e.g., the channel regions of the transistors) may be driven to an erase voltage that is substantially positive with respect to the word line gate voltages (e.g., +10 to +20V). In such a particular arrangement, negative charge may tunnel from storage locations to a substrate 1010.

Examples of possible erasing levels for an embodiment like that of FIG. 10D are shown in the table below:

TABLE 10

| Node | Condition |
|---|---|
| All Bit Lines | Float |
| All Source Lines (SL1, SL2) | Float |
| All Word Lines | 0 V to −10 V |
| SG1/SG2 | 0 V to +10 V or Float |
| All CSG | 0 V to +10 V or Float |
| Substrate (P-Well or T-Well) | +10 to 20 V |

Figure 10E:
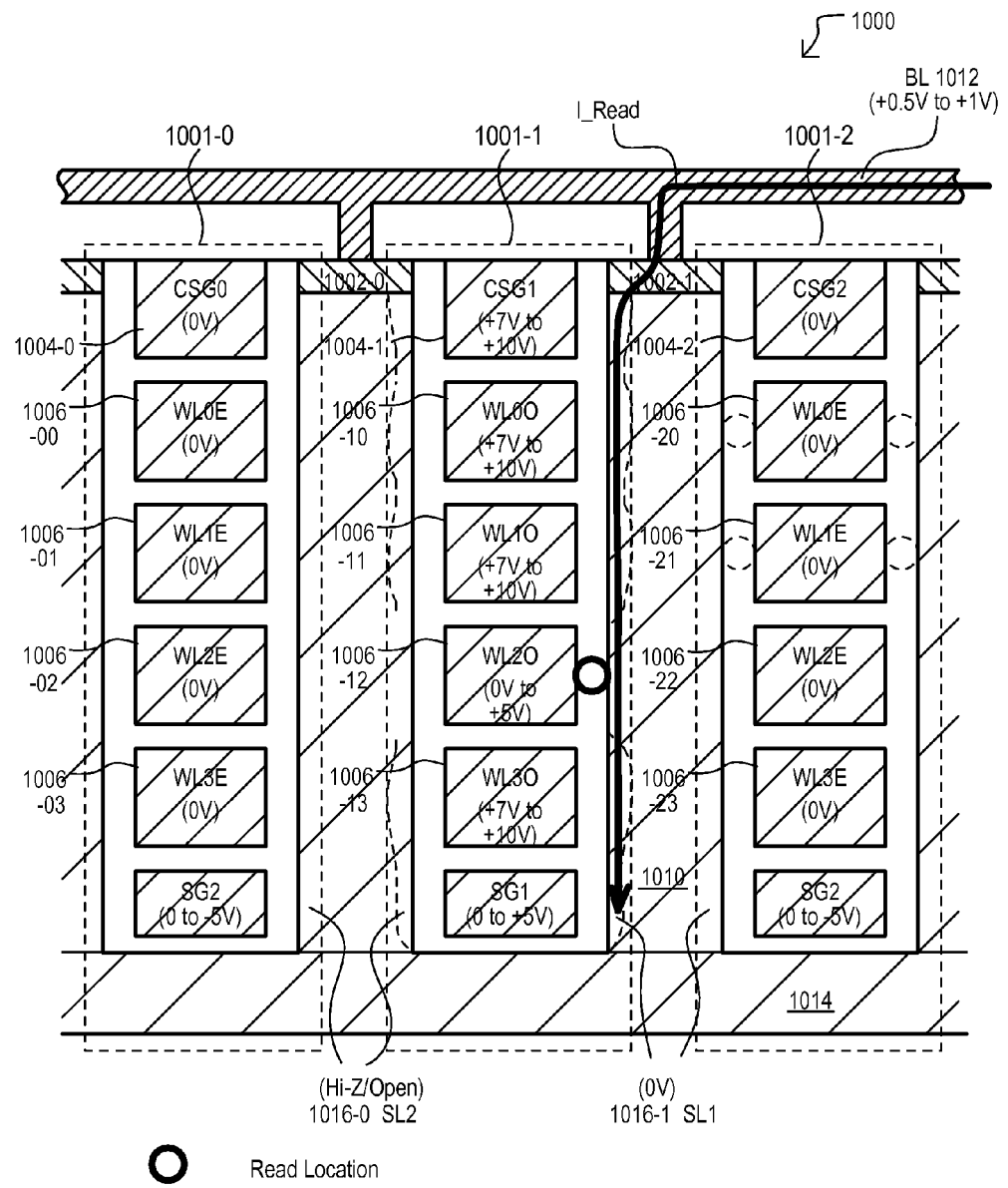

FIG. 10E shows a read operation for a right side of word line 1006-12 according an embodiment. The selection of bits for read operations may occur in a similar fashion to programming operations, except voltage levels may be different for word lines and bit line. Access gate 1004-1 is driven to a read voltage to enable bit line 1012 access to group 1001-1. Bit line 1012 may be biased to a bit line read voltage (+0.5 to 1V). Word line gates 1006-10 and -11 above the read word line gate may be driven to a pass gate potential (+7V to +10V). The read word line 1006-12 is driven to a read voltage (e.g., +0 to +5V). Word line gates below the read word line (here only 1006-13) are driven to a pass gate potential. Odd select gates 1008-1 are activated (at 0 to +5V), while even select gates (1008-0, -2) are de-activated (at 0 to −5V). Odd select line 1016-1 is connected to a low voltage, while even select line 1016-0 is placed in a high impedance state.

In such an arrangement a current (I_read) may flow to a selected source line (1016-1 in bottom of group 1001-1) from bit line 1012 depending upon a charge state on the right side of read word line 1016-12.

Examples of possible read levels for an embodiment like that of FIG. 10E are shown in the tables below:

TABLE 11

(Refer to FIG. 10E)
Reading of the Bits above SG1

| Node | Reading the right bit of WL1O under CSG1 | Reading the left bit of WL1O under CSG1 |
|---|---|---|
| BLs (selected) for Reading | 0.5 V to 1 V | 0.5 V to 1 V |
| Other BLs (unselected) | Hi Z | Hi Z |
| Selected CSG (CSG1) | 5 V to 10 V | 5 V to 10 V |
| Unselected CSGs | 0 to −5 V | 0 to −5 V |
| Selected WL (WL1O) for the selected bits | 0 V to 5 V | 0 V to 5 V |
| Unselected WL0O above the selected WL1O | 7 V to 10 V | 7 V to 10 V |
| Unselected WL2O, WL3O below the selected WL1O | 7 V to 10 V | 7 V to 10 V |
| Unselected WL0E, WL2E, WL3E of unselected stack(s) | 0 V | 0 V |
| SG1 (selected stack) | 0 V to 5 V | 0 V to 5 V |
| SG2 (unselected stack) | 0 V to −5 V | 0 V to −5 V |
| SL1 feed (tied to right channel of SG1) | 0 V | Hi Z or open |
| SL2 feed (tied to left channel of SG1) | Hi Z or open | 0 V |
| Substrate | 0 V | 0 V |

TABLE 12

(Refer to FIG. 10E)
Reading of Bits above SG2

| Node | Reading the right bit of WL1E under CSG2 | Reading the left bit of WL1E under CSG2 |
|---|---|---|
| BLs (selected) for Reading | 0.5 V to 1 V | 0.5 V to 1 V |
| Other BLs (unselected) | Hi Z | Hi Z |
| Selected CSG (CSG2) | 5 V to 10 V | 5 V to 10 V |
| Unselected CSGs (CSG0, 1) | 0 to −5 V | 0 to −5 V |
| Selected WL (WL1E) for the selected bits | 0 V to 5 V | 0 V to 5 V |
| Unselected WL0E above the selected WL1E | 7 V to 10 V | 7 V to 10 V |
| Unselected WL2E, WL3E below the selected WL1 | 7 V to 10 V | 7 V to 10 V |
| Unselected WL0O, WL2O, WL3O of unselected stack(s) | 0 V | 0 V |
| SG2 (selected stack) | 0 V to 5 V | 0 V to 5 V |
| SG1 (unselected stack) | 0 V to −5 V | 0 V to −5 V |
| SL2 feed (tied to right channel of SG2) | 0 V | Hi Z or open |
| SL1 feed (tied to left channel of SG2) | Hi Z or open | 0 V |
| Substrate | 0 V | 0 V |

The embodiments shown in FIGS. 10A to 10E show arrangements in which levels of word lines may be divided into even word lines and odd word lines that are activated separately from one another. Alternate embodiments may provide multiple word line levels, with all word lines of a level being activated together. One such embodiment is shown in FIG. 11.

Figure 11:
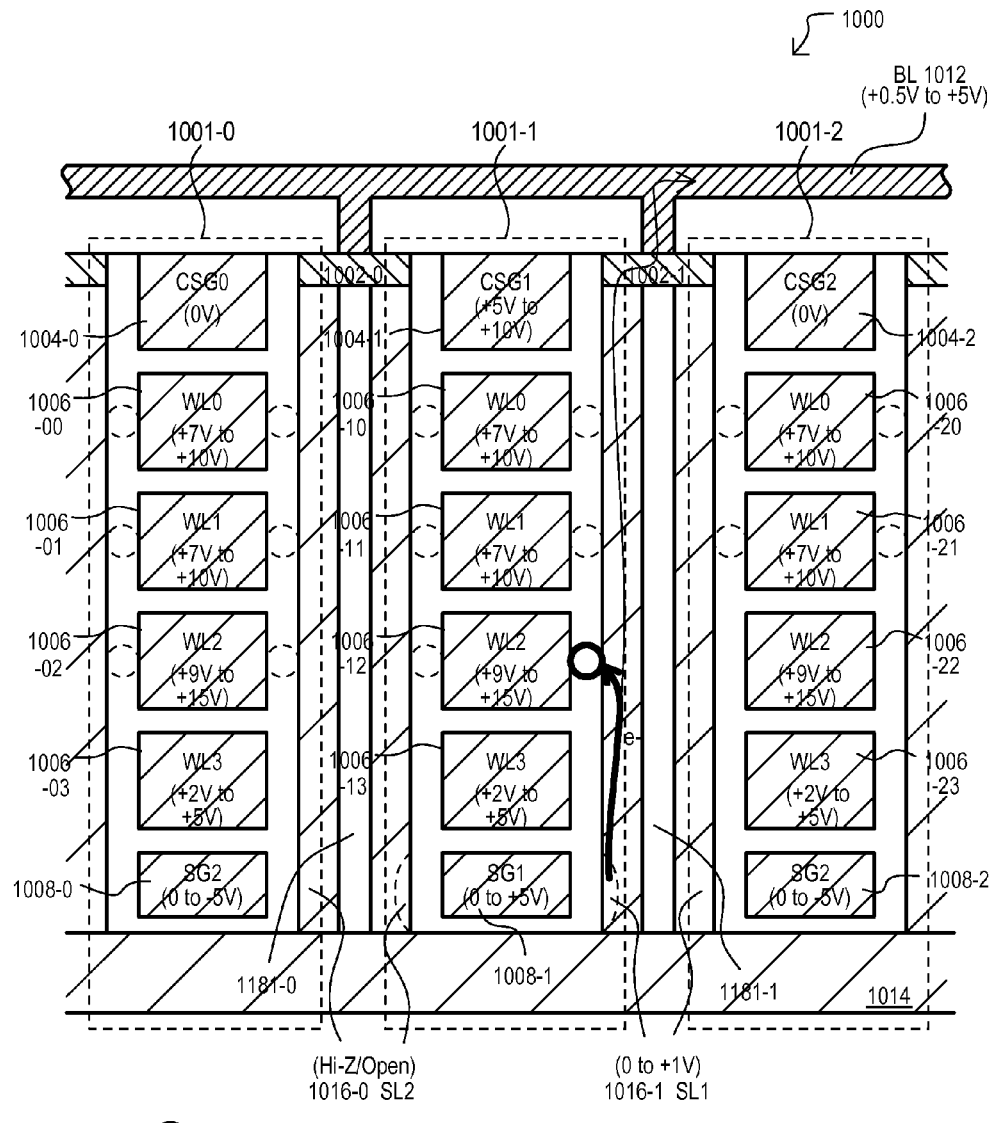
FIG. 11 is a side cross sectional view of a further NAND type memory architecture according to an embodiment.

FIG. 11 may include items like those shown in FIGS. 10A to 10E, and such like items are referred to by the same reference character. FIG. 11 may differ from FIGS. 10A to 10E in that vertical insulators 1181-0/1 may be included between groups 1001-01 to 1001-2. As will be recalled, in the embodiments of FIGS. 10A to 10E, odd and even word line gates were accessed by odd and even selector gates (SG1 or SG2) to inhibit program disturb of adjacent bits sharing the same channel regions (semiconductor channel). Such odd and even word lines can cause slightly overall reduced programming speed for the array due to setup times for odd and even word lines based on selector gate activation selection.

An embodiment like that of FIG. 11 can eliminate the need to guard against such adjacent bit disturb by separating the channel regions (vertically) of such adjacent bits. For example, if reference is made to FIG. 11, vertical insulator 1181-0 separates right side bits of word line gates 1006-00, -01, -02, -03 from left side bits of word line gates 1006-10, -11, -12, -13. In such an arrangement, word line gates of a same horizontal level may be activated together, for a more limited signal routing requirement than the embodiment of FIGS. 10A to 10E. For example, word lines gates 1006-00, -10, -20 may be activated together, word lines gates 1006-01, -11, -21 may be activated together, etc.

Referring still to FIG. 11, vertical insulators 1181-0/1 may split regions between cell groups 1001-1 to -3 into two parts. A bit line 1012 may be shared between such two parts (i.e., two channel regions). In the embodiment shown, drain diffusions 1002-0/1 may connect to both sides of such regions to bit line 1012. Reading and erasing of such an architecture may occur as described above. However, programming operations may be simplified as activation of word lines need not be separated into even and odd groups.

Examples of such a simplified programming approach are shown in the table below:

TABLE 13

(Refer to FIG. 11)

| Node | Programming the right bit of WL1 under CSG1 | Programming the left bit of WL1 under CSG1 |
|---|---|---|
| Programmed BLs (selected) | 0.5 V to 5 V | 0.5 V to 5 V |
| Other BLs (unselected) | Hi Z | Hi Z |
| Selected CSG (CSG1) | 5 V to 10 V | 5 V to 10 V |
| Unselected CSGs | 0 to −5 V | 0 to −5 V |
| Selected WL (WL1) for the selected bits | 9 V to 15 V | 9 V to 15 V |
| Unselected WL0 above the selected WL1 | 7 V to 10 V | 7 V to 10 V |
| Unselected WL2 just below the selected WL1 | 2 V to 5 V | 2 V to 5 V |
| Unselected WL3 more than one level below the selected WL1 | 7 V to 10 V | 7 V to 10 V |
| SG1 (selected stack) | 0 V to 5 V | 0 V to 5 V |
| SG2 (unselected stack) | 0 V to −5 V | 0 V to −5 V |
| SL1 feed (tied to right channel of SG1) | 0 V to 1 V | Hi Z or open |
| SL2 feed (tied to left channel of SG1) | Hi Z or open | 0 V to 1 V |
| Substrate | 0 V | 0 V |
| Optional condition for Unselected BLs, if the SG1 Vt is >0 V and SL1 is set at 0 V | 0 V | 0 V |

TABLE 14

(Refer to FIG. 11)

| Node | Programming the right bit of WL1 under CSG2 | Programming the left bit of WL1 under CSG2 |
|---|---|---|
| Programmed BLs (selected) | 0.5 V to 5 V | 0.5 V to 5 V |
| Other BLs (unselected) | Hi Z | Hi Z |
| Selected CSG (CSG2) | 5 V to 10 V | 5 V to 10 V |
| Unselected CSGs (CSG0, 1) | 0 to −5 V | 0 to −5 V |
| Selected WL (WL1) for the selected bits | 9 V to 15 V | 9 V to 15 V |
| Unselected WL0 above the selected WL1 | 7 V to 10 V | 7 V to 10 V |
| Unselected WL2 just below the selected WL1 | 2 V to 5 V | 2 V to 5 V |
| Unselected WL3 more than one level below the selected WL1 | 7 V to 10 V | 7 V to 10 V |
| SG2 (selected stack) | 0 V to 5 V | 0 V to 5 V |
| SG1 (unselected stack) | 0 V to −5 V | 0 V to −5 V |
| SL2 feed (tied to right channel of SG2) | 0 V to 1 V | Hi Z or open |
| SL1 feed (tied to left channel of SG2) | Hi Z or open | 0 V to 1 V |
| Substrate | 0 V | 0 V |
| Optional condition for Unselected BLs, if the SG2 Vt is >0 V and SL2 is set at 0 V | 0 V | 0 V |

In one very particular embodiment, transistor channel regions may be formed by depositing a channel layer. A thin insulating layer could be deposited afterward, which may be easily incorporated into existing flows (which may deposit a polysilicon fill material at this time). For a typical 60 nm process node, this insulating later can be 5 to 10 nm.

Figure 12:
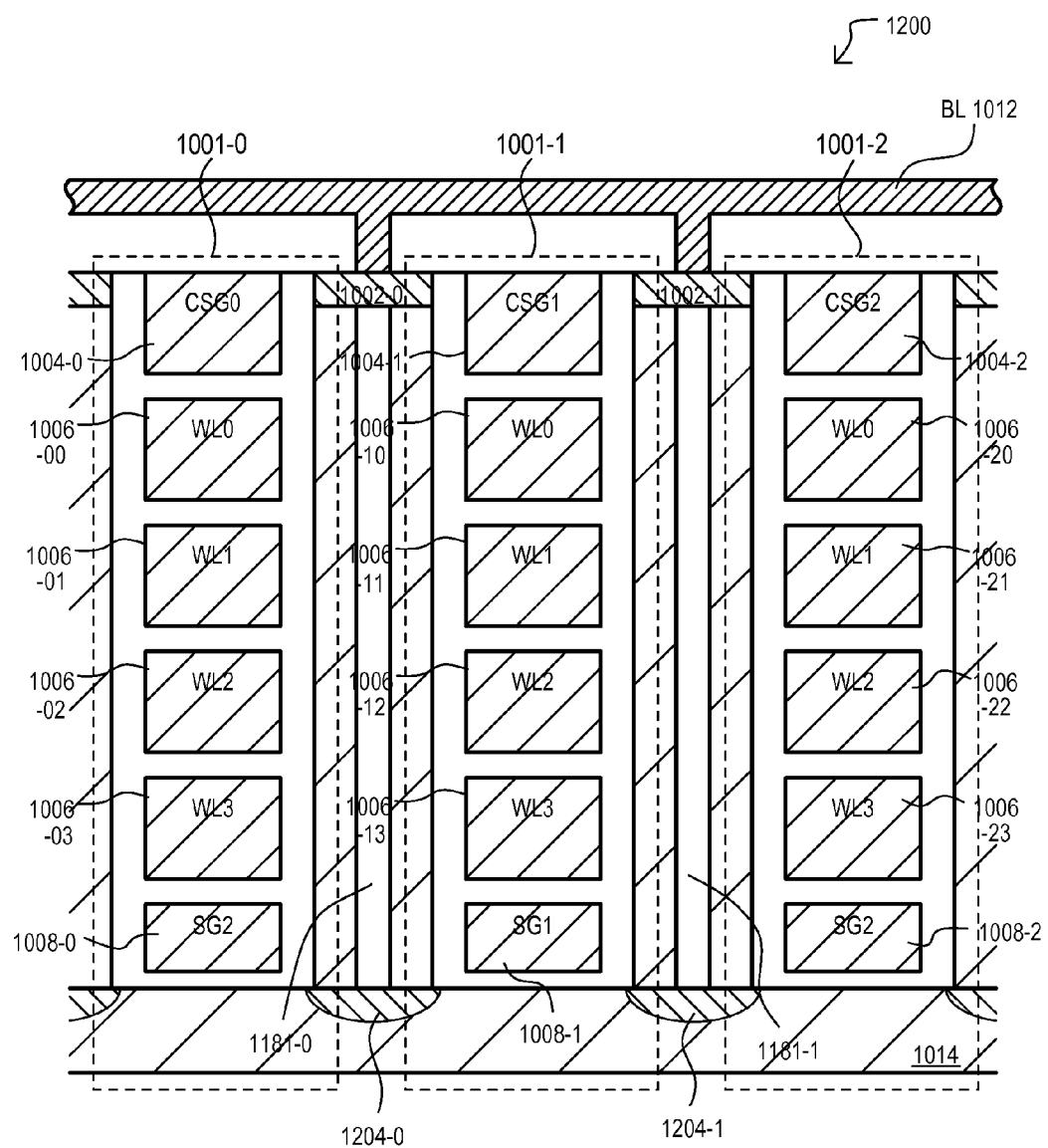
FIG. 12 is a side cross sectional view of another NAND type memory architecture according to an embodiment.

Referring now to FIG. 12, a further embodiment is shown in side cross sectional view and designated by the general reference character 1200. FIG. 12 may include items like those shown in FIG. 11, and such like items are referred to by the same reference character. FIG. 12 may differ from FIG. 11 in that source implants 1204-0/1 may be included between word line stacks at the bottom of each opening (e.g., trench). Such source implants 1204-0/1 may provide a conductive connection between source lines, when such source lines are created by a selector gate 1008-0 to -2 forming inversion layers in corresponding sides. Source implants 1204-0/1 may connect like source lines. For example, "odd" source lines may be commonly connected by source implant 1204-1, while "even" source lines may be commonly connected by source implant 1204-0. Source implants have the same conductivity as drain diffusions 1002-0, and so are N+ in the example of FIG. 12.

It is noted that erase operations via transistor channels may be accomplished by source implants 1204-0/1. For example, where source implants are formed at the bottom of openings, such openings may be accessed by a conductive "tap" and driven with an erase voltage in an erase operation.

Embodiments above have shown architecture that may program by charge injection, such as source side injection and channel hot electron injection. However, like architectures may be modified to utilize Fowler-Nordheim (FN) tunneling as a programming method. One such embodiment is shown in FIG. 13.

Figure 13:
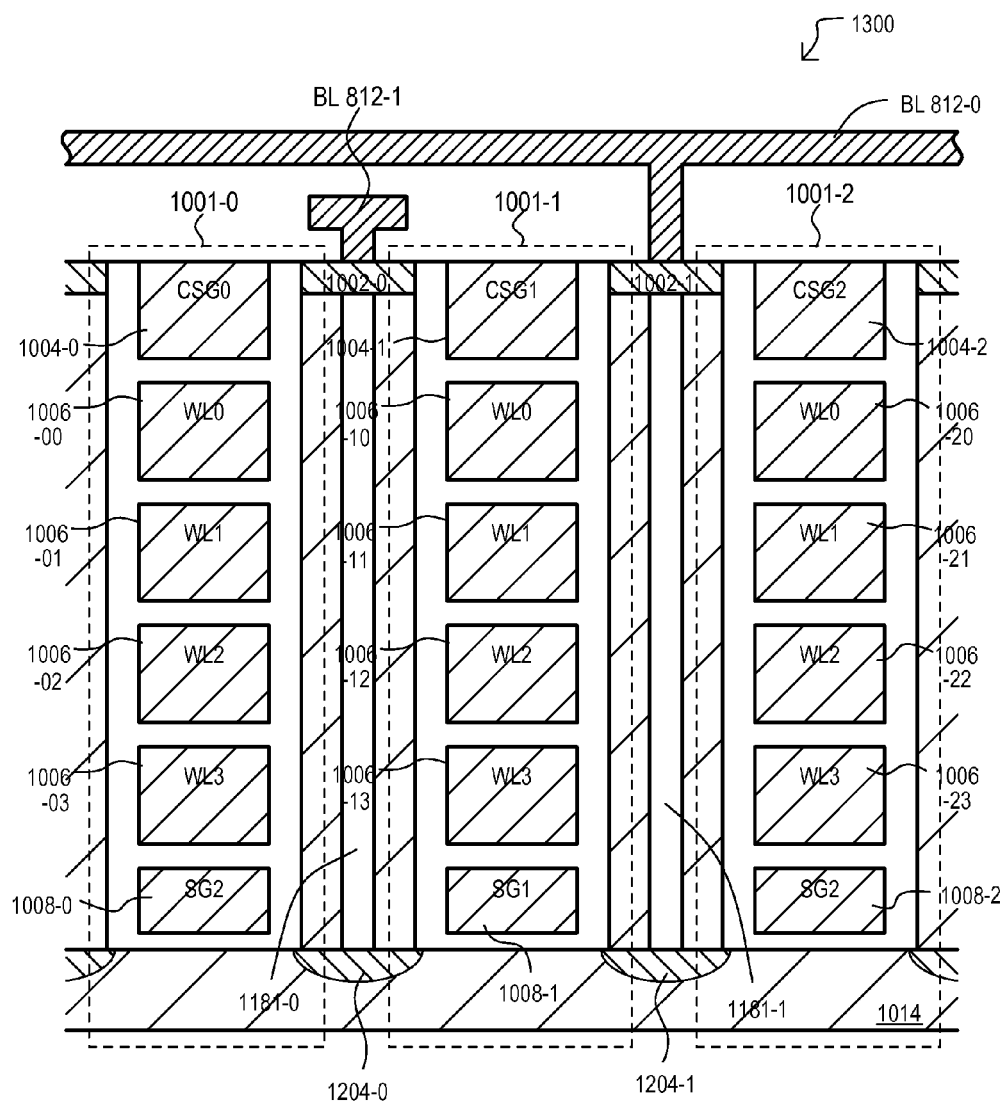
FIG. 13 is a side cross sectional view of a NAND type memory architecture according to an embodiment that may utilize Fowler-Nordheim tunneling in a programming operation.

Referring now to FIG. 13, yet a further embodiment is shown in side cross sectional view and designated by the general reference character 1300. FIG. 13 may include items like those shown in FIG. 12, and such like items are referred to by the same reference character. FIG. 13 may differ from FIG. 12 in drain regions 1002-0/1 may be connected to different bit line 812-0/1, respectively.

Separate bit lines 812-0/1 can enable a FN programming on one side of word line gate, while not programming the other side of the gate. In a programming operation, a programmed word line (1006-00 to 1006-23) may be driven to a word line program voltage (e.g., a positive voltage, such as about +20V). One bit line (e.g., 812-0) may be driven to a bit line program voltage (e.g., zero voltage), while the other bit line (e.g., 812-1) may be driven to a de-select voltage (e.g., a voltage at or near the word line program voltage, such as +10V to +20V). Thus, charge (e.g., electrons) may tunnel into a charge storage on one side of the programmed word line (that connected to the bit line at the program voltage) and not the other side (that connected to bit line 812-1 at the de-select voltage).

It is noted that in particular embodiments like that of FIG. 13, word line gates may be arranged into even and odd groups, as described for FIGS. 8A to 8E.

Figure 14:
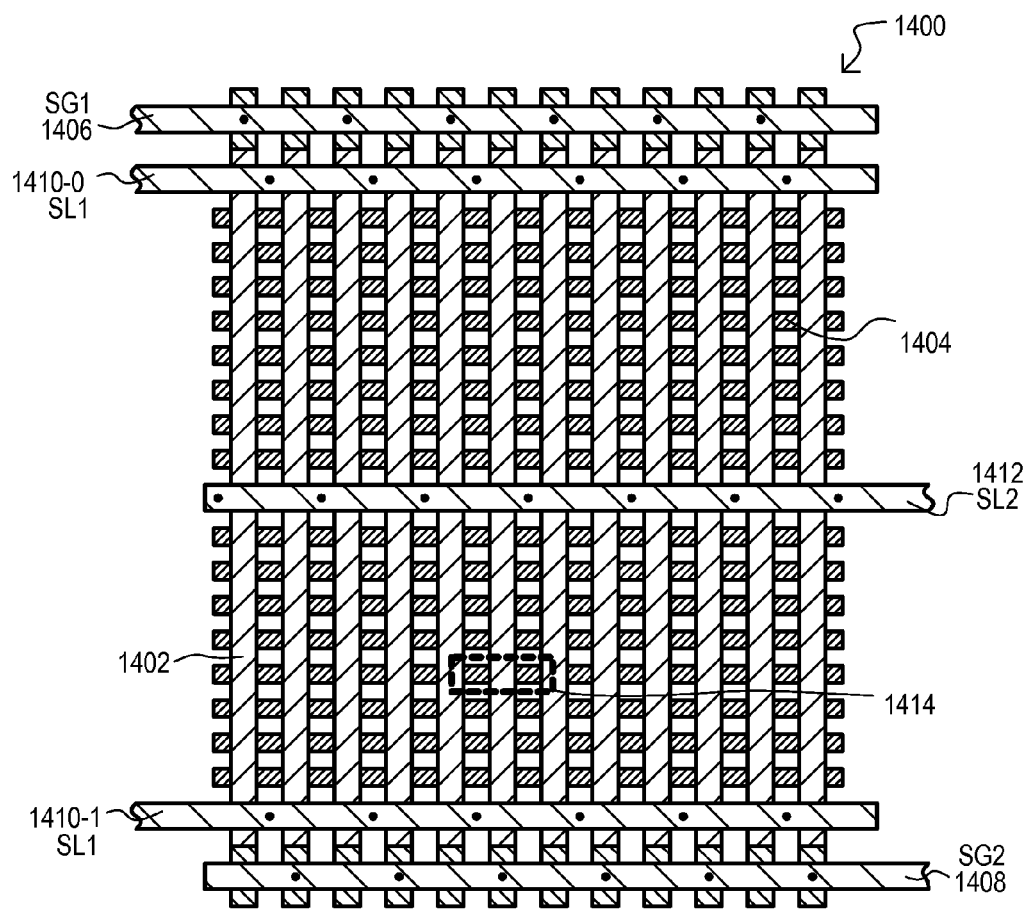
FIG. 14 is a top plan view of a memory device architecture according to an embodiment.

Referring now to FIG. 14, a memory device architecture 1400 according to an embodiment is shown in a top plan view. Architecture 1400 may include gate regions (one shown as 1402) parallel to one another (extending in the vertical direction in FIG. 14). It is understood that each gate region (e.g., 1402) may include the various gate structures shown in the embodiments above, such as any of: word line gates, selector gates, access, gates, or program gates, depending upon the particular architecture. Such gates may be contiguous structure vertically aligned with one another within an opening. Drain diffusions (one shown as 1404) may run in a direction orthogonal to gate regions (e.g., 1402), and provide locations for bit line contacts (not shown).

FIG. 14 also shows a first selector gate metallization 1406. Such a metallization may contact selector gates located within gate regions (e.g., 1402) in an alternating fashion, to provide a common connection to all "odd" selector gates. Connection points to odd selector gates are represented by dots in FIG. 14. In the particular embodiment, selector gate metallization 1406 may be situated at one end of an array.

In a similar fashion to first selector gate metallization 1406, a second selector gate metallization 1408 may contact selector gates located within gate regions (e.g., 1402) in an alternating fashion, to provide a common connection to "even" selector gates. Connection points to even selector gates are also represented by dots in FIG. 14. In the particular embodiment, second selector gate metallization 1408 may be situated at an end of an array, opposite to that of first selector gate metallization 1406.

Referring still to FIG. 14, an architecture 1400 also shows a first source metallizations 1410-0/1. First source metallizations 1410-0/1 may contact first source diffusion regions disposed between gate regions (e.g., 1404) in an alternating fashion. As understood from above, such first source diffusion regions may be connected to "odd" source lines (SL1) by activation of a selector gate. Connection points to first source diffusion regions are represented by dots. In the particular embodiment, first source metallizations 1410-0/1 may be situated at opposing ends of an array.

In a similar fashion to first source metallizations 1406-0/1, a second source metallization 1412 may contact second source diffusion regions disposed between gate regions (e.g., 1404) in an alternating fashion. Second source diffusion regions may be connected to "even" source lines (SL2) by activation of a selector gate. Connection points to second source diffusion regions are also represented by dots. In the particular embodiment, second source metallization 1412 may be situated midway through the array between first source metallizations 1410-0/1.

FIG. 14 also shows a cell area 1414. A cell area may include numerous numbers of memory cells depending upon the particular configuration. Various examples of possible cell structures included in such an area will now be described with reference to FIGS. 15 to 17.

Figure 15:
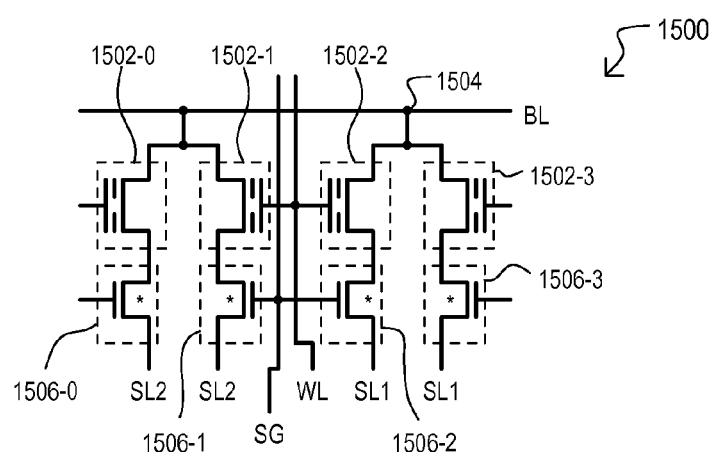
FIGS. 15 to 17 are schematic diagram representations of memory cell architectures that may be included in the embodiment of FIG. 14.

FIG. 15 is a schematic diagram of a memory cell structure that can be included in a cell area 1414. FIG. 15 may be conceptualized as representing an architecture like that of FIG. 6. Memory cells 1502-0 to -3 may each store two data bits, and may be connected to a same bit line 1504. A common word line WL may be connected memory cells 1502-1 and -2.

FIG. 15 also shows inversion structures 1506-0 to -3. Inversion structures 1506-0 to -3 represent source lines that may be created by a selector gate creating inversion regions. As shown, inversion structures 1506-0 to -3 may connect memory cells 1502-1 and -2 to different source lines (SL1 or SL2).

It is understood that selector gate SG and word line WL may be vertically stacked with one another within an opening.

Figure 16:
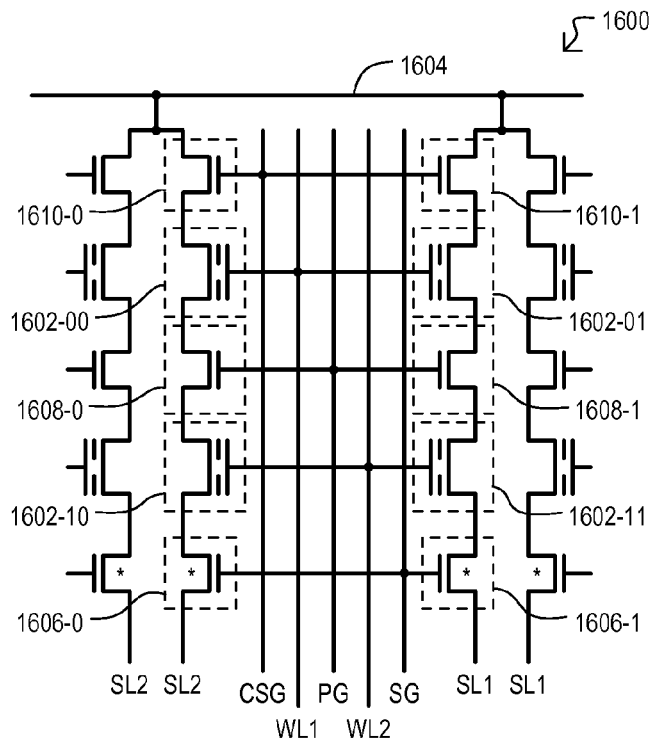

FIG. 16 is a schematic diagram of a further memory cell structure that can be included in a cell area 1414. FIG. 16 may be conceptualized as representing an architecture like that of FIG. 9. "Upper" memory cells 1602-00 and -01 and "lower" memory cells 1602-10 and -11 may each store two data bits. Upper memory cells 1602-00/01 may be connected to upper word line WL1, while lower memory cells 1602-10/11 may be connected to lower word line WL2. Upper memory cells 1602-00/01 may be separated from lower memory cells 1602-10/11 by program areas 1608-0/1 connected to program gate line PG. Program areas 1608-0/1 may correspond to areas that may be inverted or serve as charge injection regions by activation of program gate line PG.

Access structures 1610-0 and -1 are shown connecting memory cells to bit line 1604. Access structure 1610-0/1 represent inversion regions that may be created by an access gate line CSG.

As in the case of FIG. 15, inversion structures 1606-0 to -1 are shown that represent source lines that may be created by a selector gate creating inversion regions. As shown, inversion structures 1606-0/1 may connect memory cells 1602-00/10 and -01/11 to different source lines (SL1 or SL2).

It is understood that access gate line CSG, selector gate SG, program gate line PG, and word lines WL1/2 may be vertically stacked with one another within an opening.

Figure 17:
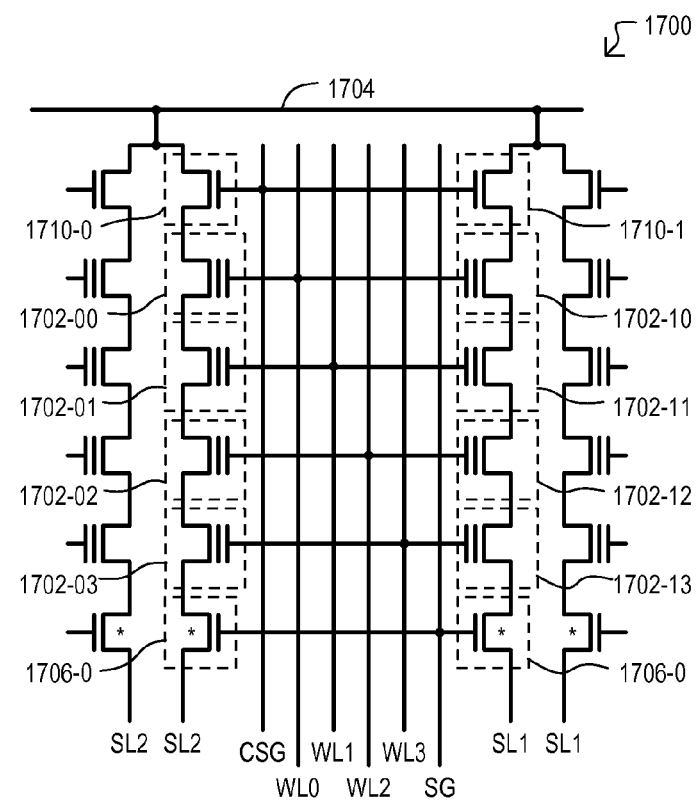

FIG. 17 is a schematic diagram of another memory cell structure that can be included in a cell area 1414. FIG. 17 may be conceptualized as representing an architecture like those of FIGS. 10A to 12. Memory cells 1702-00 to 1702-13 may be formed on opposing sides of word lines WL0 to WL3. Word line WL0 may be connected to memory cells 1702-00/10, word line WL1 may be connected to memory cells 1702-10/11, etc.

Like FIG. 16, FIG. 17 shows access structures 1710-0/1 that may connect the memory cells (1702-00 to 13) to bit line 1704, and represent inversion regions that may be created by an access gate line CSG.

As in the case of FIG. 16, inversion structures 1706-0 to -1 are shown that represent source lines that may be created by a selector gate SG creating inversion regions. As shown, inversion structures 1706-0/1 may connect memory cells 1702-00 to -13 to different source lines (SL1 or SL2).

It is understood that access gate line CSG, word lines WL0-3, and selector gate line SG may be vertically stacked with one another within an opening.

It is understood that other embodiments are within the scope of the disclosure and claims, and the particular embodiments shown herein are exemplary.

Embodiments of the disclosure can be applied to memory arrays with interfaces that resemble NAND-FLASH interfaces, such as the known Spansion ORNAND array. The vertically oriented memory cell transistors described can be based on either floating gate storage, nitride storage, nanoparticle storage gate or other types of suitable charge storage technology.

While embodiments above have shown memory cells, architectures, devices and methods directed to NOR and NAND type nonvolatile memory devices, in other embodiments such vertical transistor and selector gate configurations may be utilized in other memory types. One very particular alternate embodiment is shown in FIG. 18.

Figure 18:
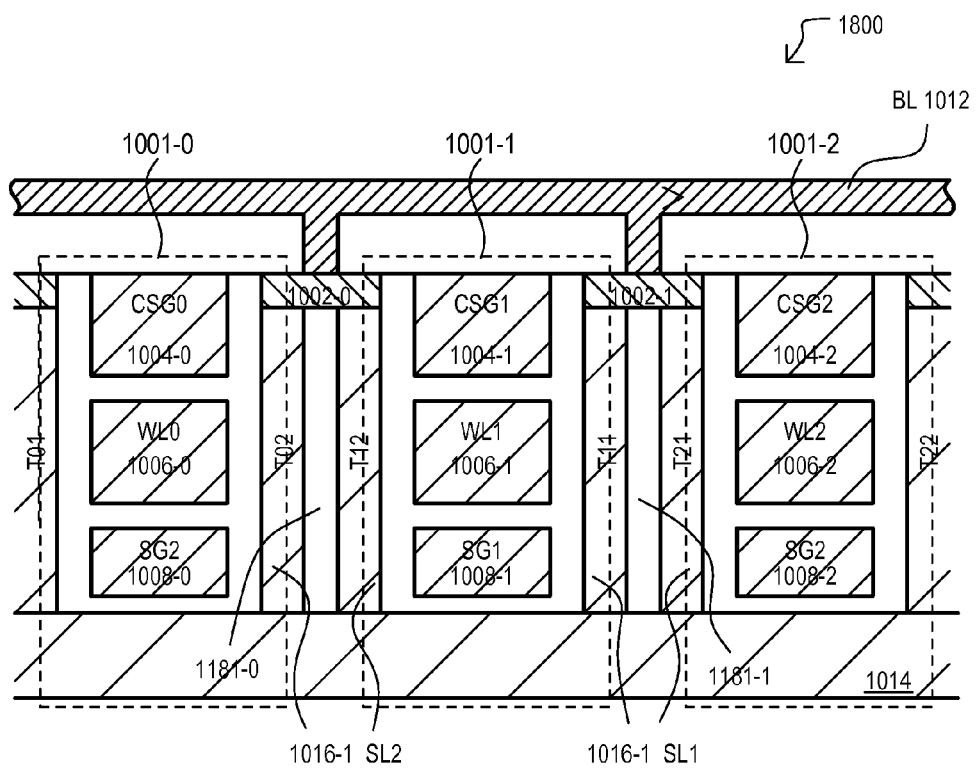
FIG. 18 is a side cross sectional view of a dynamic random access memory (DRAM) according to an embodiment.

Referring now to FIG. 18, a dynamic random access memory (DRAM) according to one embodiment is shown in a side cross sectional view, and designated by the general reference character 1800. DRAM 1800 may include structures similar to those of FIG. 11, and such structures are referred to by the same reference characters.

A DRAM 1800 may be a "capacitorless" DRAM, relying on the presence of absence of charged stored within vertical body areas to store a data bit. A read current may vary according to such a body charged state.

In some embodiments, a substrate 1014 may be an insulator. Cells T02, T12, T11 and T21 may be formed from any suitable semiconductor materials, including but not limited to polysilicon. Regions 1181-0/1 are insulators, as in the case of FIG. 11.

Various operations for the DRAM 1800 are described below in tables. From such tables it is understood that word lines 1006-0 to -2 may be activated individually, rather than in even and odd groups, or in rows, as shown in the above NOR/NAND embodiments. Vertical DRAM transistors are represented at their body locations by the reference characters T01, T02, T11, T12, T21, T22.

Very particular examples of programming (writing one logic value) operations for an embodiment like that of FIG. 18 are shown below. In such programming operations, charge may be injected into the body region of the programmed cell (i.e., T11, T21).

TABLE 15

(Refer to FIG. 18)

| Node | Programming of cell T11 |
|---|---|
| Selected CSG (CSG1) | ~8 V |
| Unselected CSGs (CSG0, 2) | 0 V |
| Selected WL (WL1) | ~5 V |
| Unselected WLs (WL0, WL2) | ~0 V |
| Selected Bit line (bit line connected to T11) | ~5 V |
| Unselected Bit lines (Not shown) | ~0 V |
| SG1 (selected stacks) | ~5 V |
| SG2 (unselected stacks) | ~0 V |
| SL1 feed (tied to right channel of SG1) | ~0 V |
| SL2 feed (tied to left channel of SG1) | Hi Z |

TABLE 16

(Refer to FIG. 18)

| Node | Programming of cell T21 |
|---|---|
| Selected CSG (CSG2) | ~8 V |
| Unselected CSGs (CSG0, 1) | 0 V |
| Selected WL (WL2) | ~5 V |
| Unselected WLs (WL0, WL1) | ~0 V |
| Selected Bit line (bit line connected to T21) | ~5 V |
| Unselected Bit lines (Not shown) | ~0 V |
| SG1 (unselected stacks) | ~0 V |
| SG2 (selected stacks) | ~5 V |
| SL1 feed (tied to left channel of SG2) | ~0 V |
| SL2 feed (tied to right channel of SG2) | Hi Z |

Very particular examples of read operations for an embodiment like that of FIG. 18 are shown below:

TABLE 17

(Refer to FIG. 18)

| Node | Reading of cell T11 |
|---|---|
| Selected CSG (CSG1) | ~3 V |
| Unselected CSGs (CSG0, 2) | 0 V |
| Selected WL (WL1) | ~1 V |
| Unselected WLs (WL0, WL2) | ~0 V |
| Selected Bit line (bit line connected to T11) | ~1 V |
| Unselected Bit lines (Not shown) | ~0 V |
| SG1 (selected stacks) | ~5 V |
| SG2 (unselected stacks) | ~0 V |
| SL1 feed (tied to right channel of SG1) | ~0 V |
| SL2 feed (tied to left channel of SG1) | Hi Z |

TABLE 18

(Refer to FIG. 18)

| Node | Reading of cell T21 |
|---|---|
| Selected CSG (CSG2) | ~3 V |
| Unselected CSGs (CSG0, 1) | 0 V |
| Selected WL (WL2) | ~1 V |
| Unselected WLs (WL0, WL1) | ~0 V |

TABLE 18-continued (Refer to FIG. 18)

| Node | Reading of cell T21 |
|---|---|
| Selected Bit line (bit line connected to T21) | ~1 V |
| Unselected Bit lines (Not shown) | ~0 V |
| SG1 (unselected stacks) | ~0 V |
| SG2 (selected stacks) | ~5 V |
| SL1 feed (tied to left channel of SG2) | ~0 V |
| SL2 feed (tied to right channel of SG2) | Hi Z |

The above-described read operations may measure a drain current flowing through a memory cell. A programmed cell may have a higher drain current than a nonprogrammed cell.

It is understood that read operations described above may be "destructive". That is a read operation may remove the charge stored in the body. Accordingly, devices implementing such cells may include refresh operations that re-program (if read data indicates so) a memory cell in a refresh operation.

As noted above, a DRAM like that of FIG. 18 may provide a read current that varies according to charge stored in a body of a transistor, which extends in the vertical direction. Thus, an amount of charge stored (and hence strength of a read signal) may be increased by increasing a size of memory cells in the vertical direction. Accordingly, charge storage may be increased in such devices without requiring more area in a lateral direction. This is in very sharp contrast to DRAM cells having capacitors and/or charge storage channels oriented in a lateral (i.e., horizontal direction).

It is understood that the above voltage levels are provided for but one embodiment. A structure like that shown in FIG. 18 may have varying modes of operation. One skilled in the art would arrive at varying voltage levels depending upon geometry, materials, doping, and process particulars, to name but a few examples.

While embodiments have been described as including openings or trenches formed within a substrate, it is understood that such structure encompass "fin" type transistors, with the fin being the substrate portion between such openings/trenches. In one very particular embodiment, openings may be formed by first forming vertically aligned gate structures (that include word line gates, and any other gates needed, such as selector gates and/or access gates) by depositing and patterning multiple gate layers into rows, each composed of stacked lines. One or more Insulating materials may then be formed on the sides of such word lines. Areas between such stacked lines may then be filled with a semiconductor material (and a separating insulating material in some embodiments). Accordingly, it is understood that an opening (or "trench") describes a spacing between semiconductor regions in which vertically aligned gates are located, and should not be construed as being limited to any particular fabrication process.

It is further noted that while the above embodiments have shown memory cells having N-type drains and P-type bodies and/or channels, alternate embodiments may include reverse doping arrangements (e.g., P-type drains, N-type bodies and/or channels).

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claims require more features than are expressly recited in each claim. Rather, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A memory device, comprising:
a plurality of cell pairs including
insulator regions interposed between opposing sides of a plurality of word line gates and first and second vertical sides formed by a spacing within at least one semiconductor material; and
at least one selector gate vertically aligned with the word line gates within the spacing configured to enable first and second source regions in the first and second vertical sides, respectively; and
a controller electrically coupled to the first and second source regions configured to drive the first and second source regions to different bias states; wherein
when the selector gate is enabled, the first and second source regions are connected to different source diffusion regions by inverting portions of the first and second vertical sides to create first type conductivity regions within a second conductivity type substrate.

2. The memory device of claim 1, wherein:
the cell pairs further include
a first drain diffusion region in the first vertical side on a top surface of the semiconductor material,
a second drain diffusion region in the second vertical side on a top surface of the semiconductor material, and
a bit line conductively connected to at least the first drain diffusion region.

3. The memory device of claim 1, wherein:
the cell pairs further include an access gate configured to electrically connect portions of the first and second vertical sides to at least one bit line; wherein
the word line gates are vertically aligned between the at least one selector gate and the access gate within the spacing.

4. The memory device of claim 1, wherein:
the insulator regions comprise charge storage regions; and
the memory device is a nonvolatile memory that stores at least one bit in opposing sides of the at least one common word line gate.

5. The memory device of claim 4, wherein:
the memory device is a nonvolatile memory that stores a plurality of bits on opposing sides of the at least one common word line gate.

6. The memory device of claim 1, wherein:
the at least one semiconductor material is selected from substantially monocrystalline silicon, polycrystalline silicon, and combinations thereof.

7. The memory device of claim 1, wherein:
the plurality of word line gates includes at least four word lines gates vertically aligned with one another within the spacing.

8. A memory device, comprising:
a plurality of cell pairs each including
insulator regions interposed between opposing sides of at least one common word line gate and first and second vertical sides formed by a spacing within at least one semiconductor material; and
at least one selector gate vertically aligned with the word line gate within the spacing and configured to enable first and second source regions in the first and second vertical sides, respectively;
an access gate configured to electrically connect portions of the first and second vertical sides to at least one bit line, each word line gate being vertically aligned between the at least one selector gate and the access gate within the spacing;
a controller electrically configured to drive first and second source diffusion regions to different bias states; wherein
when the selector gate is enabled, the first and second source regions are connected to the first and second source diffusion regions, respectively, by inverting portions the first and second vertical sides to create first type conductivity regions within a second conductivity type substrate.

* * * * *